(12) United States Patent
Kim

(10) Patent No.: US 10,033,017 B2
(45) Date of Patent: Jul. 24, 2018

(54) ORGANIC LIGHT EMITTING DISPLAY DEVICE AND METHOD OF MANUFACTURING THE SAME

(71) Applicant: SAMSUNG DISPLAY CO., LTD., Yongin-si, Gyeonggi-do (KR)

(72) Inventor: Dong-Gyu Kim, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 29 days.

(21) Appl. No.: 14/936,935

(22) Filed: Nov. 10, 2015

(65) Prior Publication Data

US 2016/0149165 A1 May 26, 2016

(30) Foreign Application Priority Data

Nov. 21, 2014 (KR) .......................... 10-2014-0163616

(51) Int. Cl.
| | | |
|---|---|---|
| H01L 51/00 | (2006.01) | |
| H01L 35/24 | (2006.01) | |
| H01L 29/08 | (2006.01) | |
| H01L 51/52 | (2006.01) | |
| H01L 27/32 | (2006.01) | |

(52) U.S. Cl.
CPC ........ H01L 51/5284 (2013.01); H01L 27/326 (2013.01); *H01L 27/322* (2013.01); *H01L 27/3216* (2013.01); *H01L 27/3246* (2013.01); *H01L 27/3276* (2013.01);
(Continued)

(58) Field of Classification Search
CPC ............... H01L 27/326; H01L 27/3276; H01L 27/3246; H01L 51/5234; H01L 51/5284; H01L 27/32–27/3297; H01L 2227/32–2227/326; H01L 2251/10–2251/568; H01L 51/00; H01L 27/28; H01L 2251/00
USPC .... 257/40, 59, E51.018, 72, 88; 438/34, 28; 345/690, 76
See application file for complete search history.

(56) References Cited

U.S. PATENT DOCUMENTS

| | | | | |
|---|---|---|---|---|
| 2006/0017867 | A1* | 1/2006 | Kusafuka | G02F 1/133512 349/109 |
| 2011/0140117 | A1* | 6/2011 | Lee | H01L 27/12 257/59 |

(Continued)

FOREIGN PATENT DOCUMENTS

| | | |
|---|---|---|
| KR | 10-2010-0052947 A | 5/2010 |
| KR | 10-2012-0019016 A | 3/2012 |

(Continued)

*Primary Examiner* — Lex Malsawma
*Assistant Examiner* — Nduka Ojeh
(74) *Attorney, Agent, or Firm* — Lee & Morse, P.C.

(57) ABSTRACT

An organic light emitting display device has a display region and a first peripheral region surrounding at least one side of the display region. The organic light emitting display device includes a first substrate a first substrate, a plurality of pixels on the first substrate, the plurality of pixels being included in the display region, at least one of the plurality of pixels including an organic light emitting element, and a driving circuit on the first substrate and in the first peripheral region. At least one of the pixels includes a first transmission portion and at least one light emitting portion, and the first peripheral region includes at least one second transmission portion.

25 Claims, 23 Drawing Sheets

(52) U.S. Cl.
   CPC ...... *H01L 27/3293* (2013.01); *H01L 51/5246* (2013.01); *H01L 51/5256* (2013.01); *H01L 51/5281* (2013.01)

(56) References Cited

U.S. PATENT DOCUMENTS

| | | | | |
|---|---|---|---|---|
| 2012/0105942 | A1* | 5/2012 | Nakagawa | G02F 1/167 359/296 |
| 2013/0208017 | A1* | 8/2013 | Gu | G09G 3/003 345/690 |
| 2014/0049453 | A1* | 2/2014 | Lee | G09G 3/20 345/55 |
| 2015/0300599 | A1* | 10/2015 | Lee | F21V 9/08 349/61 |
| 2015/0340655 | A1* | 11/2015 | Lee | H01L 51/525 257/40 |
| 2016/0037608 | A1* | 2/2016 | Ikeda | H05B 33/12 362/235 |
| 2017/0031643 | A1* | 2/2017 | Jeong | G06F 3/1446 |

FOREIGN PATENT DOCUMENTS

| | | |
|---|---|---|
| KR | 10-2013-0139592 A | 12/2013 |
| KR | 10-2014-0002392 A | 1/2014 |

\* cited by examiner

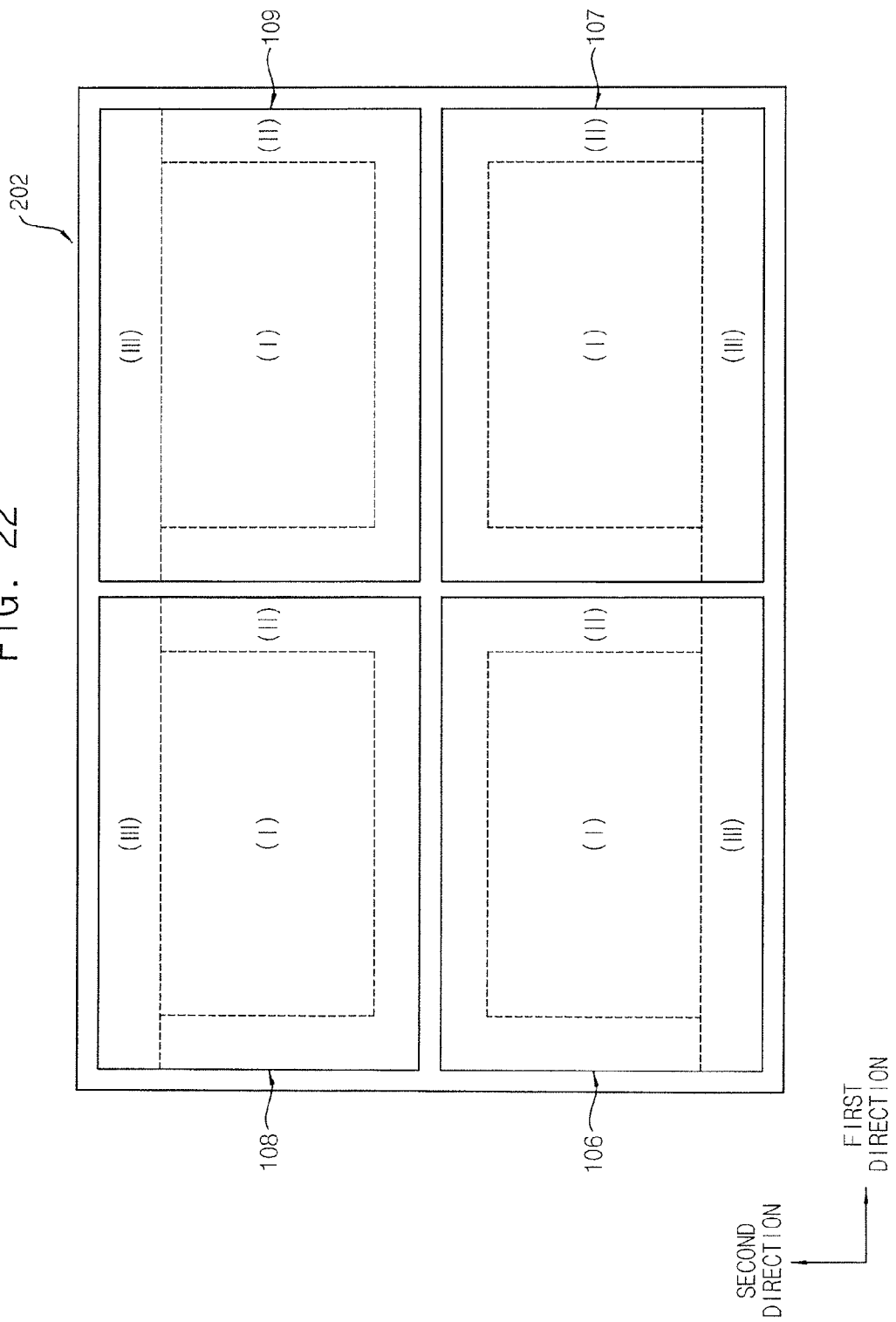

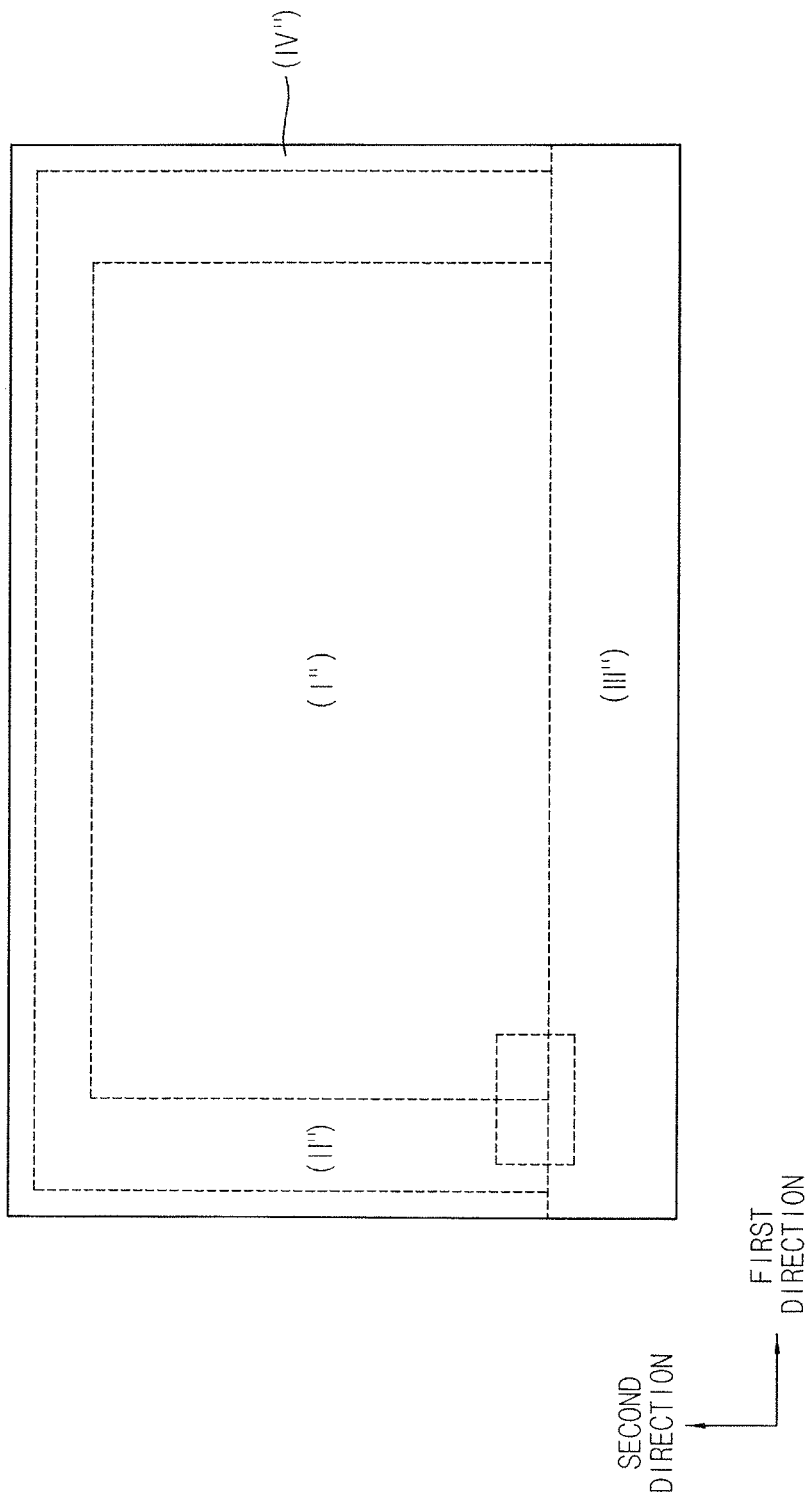

ORGANIC LIGHT EMITTING DISPLAY DEVICE AND METHOD OF MANUFACTURING THE SAME

CROSS-REFERENCE TO RELATED APPLICATION

Korean Patent Application No. 10-2014-0163616, filed on Nov. 21, 2014, in the Korean Intellectual Property Office, and entitled: "Organic Light Emitting Display Device and Method of Manufacturing The Same," is incorporated by reference herein in its entirety.

BACKGROUND

1. Field

Example embodiments relate to an organic light emitting display device and a method of manufacturing the same. More particularly, example embodiments relate to a transparent organic light emitting display device and a method of manufacturing the same.

2. Description of the Related Art

Displays include a plurality of pixels which emit light to form an image. The pixels of OLED displays include an organic light emitting diode (OLED). The OLEDs emit light having a wavelength that depends on the type of organic material included in the light-emitting layer of the OLED. For example, the OLEDs can include different types of organic materials in order to emit one of a red, green, and blue colored light. The OLED displays mix light having different colors emitted by the OLEDs to form a color image. Recently, OLED displays having a predetermined transmittance have been studied.

SUMMARY

Example embodiments provide an organic light emitting display device having an unrecognizable interface between a display region and a peripheral region.

Example embodiments provide a method of manufacturing an organic light emitting display device having an unrecognizable interface between a display region and a peripheral region.

According to example embodiments, there is provided an organic light emitting display device having a display region and a first peripheral region surrounding at least one side of the display region. The organic light emitting display device includes a first substrate, a plurality of pixels on the first substrate, the plurality of pixels being included in the display region, at least one of the plurality of pixels including an organic light emitting element, and a driving circuit on the first substrate and in the first peripheral region, wherein at least one of the pixels includes a first transmission portion and at least one light emitting portion, and the first peripheral region includes at least one second transmission portion.

In example embodiment, the organic light emitting display device may further include a second peripheral region surrounding at least one side of the display region where the first peripheral region does not locate.

In example embodiment, the second peripheral region may sufficiently surround one side of the display region.

In example embodiment, the second peripheral region may partially surround one side of the display region.

In example embodiment, the first peripheral region and the display region may have an identical transmittance.

In example embodiment, the first peripheral region may have a transmittance which is lower than a transmittance of the display region.

In example embodiment, the organic light emitting display device may further include a third peripheral region surrounding the first peripheral region at an edge of the first substrate. The third peripheral region may have a transmittance which is higher than a transmittance of the first peripheral region.

In example embodiment, an area of each first transmission portion may be identical to an area of each second transmission portion.

In example embodiment, an area of each second transmission portion may be smaller than an area of each first transmission portion.

In example embodiment, an area of each second transmission portion may be larger than an area of each first transmission portion.

In example embodiment, a distance between adjacent second transmission portions may be identical to a distance between adjacent first transmission portions.

In example embodiment, a distance between adjacent second transmission portions may be larger than a distance between adjacent first transmission portions.

In example embodiment, the organic light emitting display device may further include a second substrate opposed to the first substrate, a black matrix disposed on the second substrate and a color filter disposed on the second substrate.

In example embodiment, the black matrix may expose the first transmission portion, the second transmission portion and the at least one light emitting portion. The color filter may overlap the at least one light emitting portion.

In example embodiment, the organic light emitting display device may further include a filling disposed at a space between the first substrate and the second substrate.

In example embodiment, the organic light emitting display device may further include a fixing member disposed on sides of the first substrate and the second substrate. The fixing member may hold the first substrate and the second substrate.

In example embodiment, the organic light emitting display device may further include an encapsulation structure covering the organic light emitting element and the driving circuit.

In example embodiment, the encapsulation structure may include at least one organic layer and at least one inorganic layer which are stacked sequentially and alternately.

In example embodiment, the encapsulation structure may include at least one inorganic layer.

In example embodiment, the encapsulation structure may include at least one organic layer.

In example embodiment, the driving circuit may include a scan driving circuit and/or a light emitting control circuit.

In example embodiment, the driving circuit may include scan lines, light emitting control lines and data lines.

In example embodiment, the at least one second transmission portion may include a plurality of second transmission portions, and the plurality of second transmission portions may be arranged in a first direction and a second direction. The first direction and the second direction may be substantially parallel to a top surface of the first substrate, and may be substantially perpendicular to each other.

According to example embodiments, there is provided an organic light emitting display device having a display region and a first peripheral region surrounding at least one side of the display region. The organic light emitting display device includes a first lower substrate, a plurality of pixels on the first substrate, the plurality of pixels being included in the display region, at least one of the plurality of pixels including an organic light emitting element, a driving circuit on the first lower substrate and in the first peripheral region, a second lower substrate adjacent to the first lower substrate, the second lower substrate having a structure identical to a structure of the first lower substrate, and an upper substrate overlapping the first lower substrate and the second lower substrate. At least one of the pixels includes a first transmission portion and at least one light emitting portion, and the first peripheral region includes at least one second transmission portion.

In example embodiment, the organic light emitting display device may further include a black matrix disposed on the upper substrate and a color filter disposed on the upper substrate.

In example embodiment, the black matrix may expose the first transmission portion, the second transmission portion and the at least one light emitting portion, and may cover a gap between the first lower substrate and the second lower substrate. The color filter may overlap the at least one light emitting portion.

In example embodiment, the organic light emitting display device may further include a seal disposed between the first lower substrate and the second lower substrate. The seal may hold the first lower substrate and the second lower substrate.

BRIEF DESCRIPTION OF THE DRAWINGS

Features will become apparent to those of ordinary skill in the art by describing in detail exemplary embodiments with reference to the attached drawings, in which:

FIG. 22 illustrates a plan view of an organic light emitting display device in accordance with some example embodiments; and FIG. 23 illustrates a plan view of an organic light emitting display device in accordance with some example embodiments.

DETAILED DESCRIPTION

Figure 1:
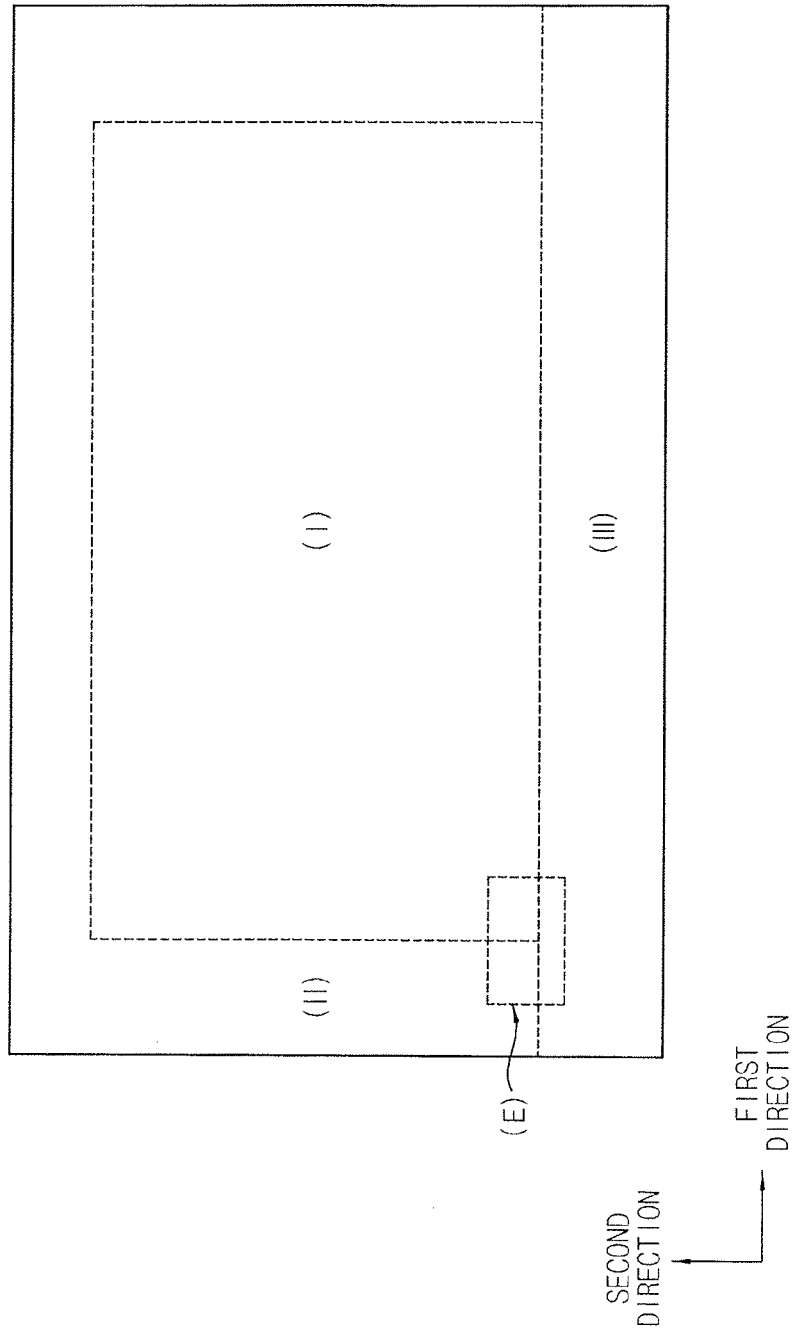
FIG. 1 illustrates a plan view of an organic light emitting display device in accordance with some example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
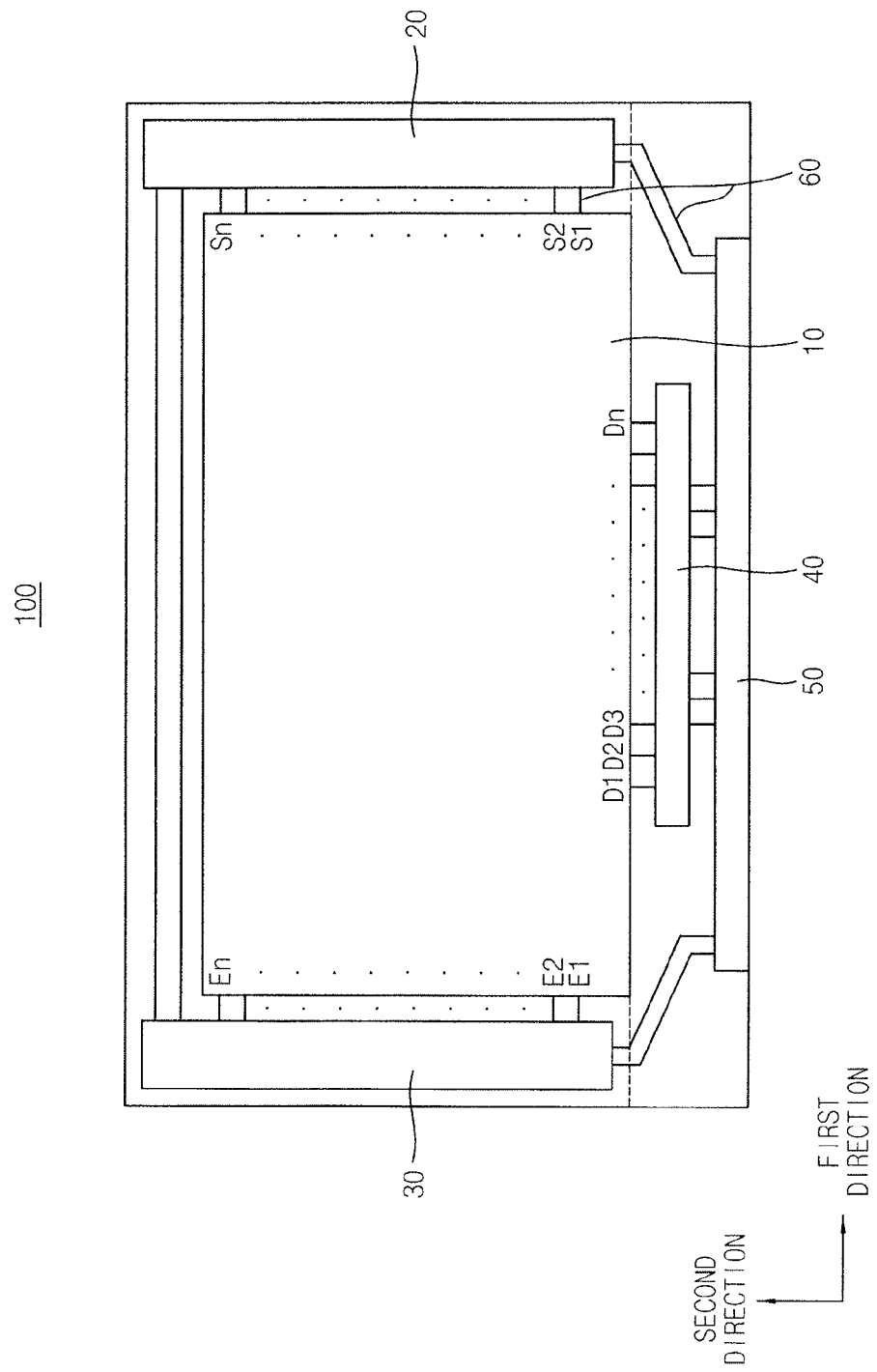
FIG. 2 illustrates a plan view of an organic light emitting display device in accordance with some example embodiments.
Figure 3:
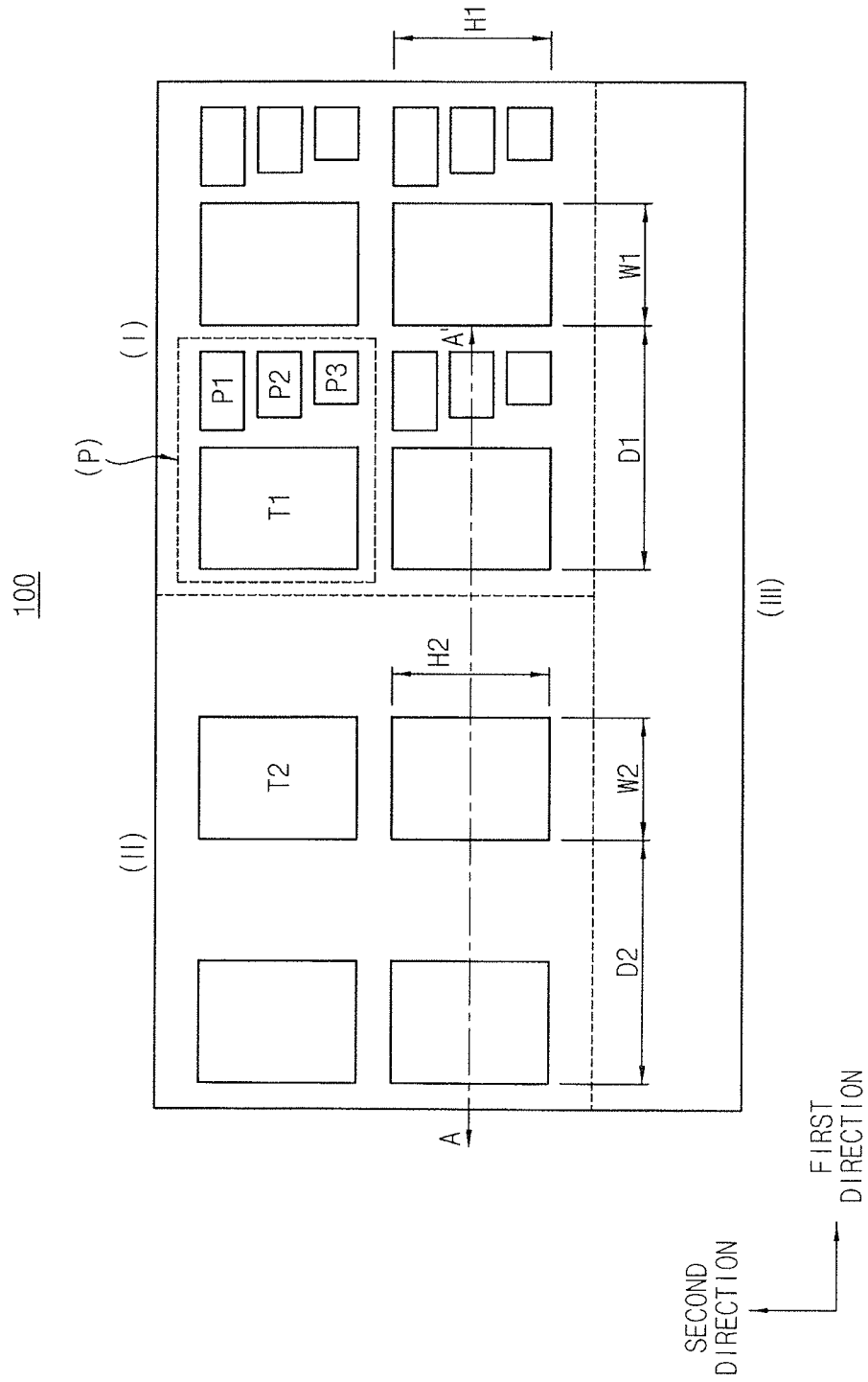
FIG. 3 illustrates an enlarged plan view of region (E) of FIG. 1.
Figure 4:
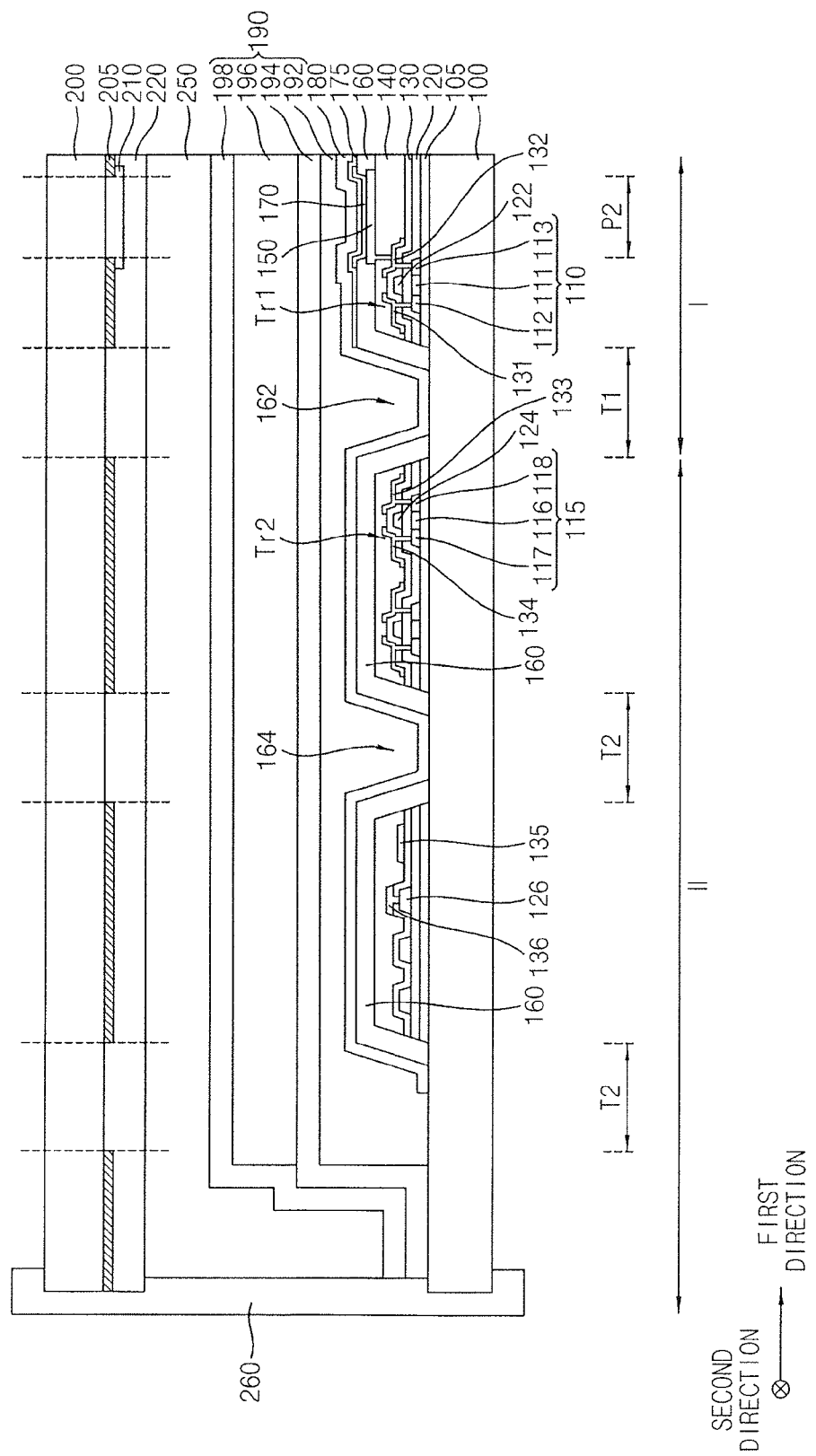
FIG. 4 illustrates a cross sectional view along line A-A' of FIG. 3.

FIGS. 1 to 4 illustrate plan views and a cross sectional view of an organic light emitting display device in accordance with some example embodiments. That is, FIG. 1 is a schematic plan view of an organic light emitting display device in accordance with some example embodiments, and FIG. 2 is a detailed plan view of the organic light emitting display device in FIG. 1. FIG. 3 illustrates an enlarged plan view of region (E) of FIG. 1, and FIG. 4 is a cross sectional view along line A-A' of FIG. 3.

Referring to FIG. 1, the organic light emitting display device includes a display region (I), a first peripheral region (II), and a second peripheral region (III). Accordingly, a first substrate 100 may be also divided into the display region (I), the first peripheral region (II), and the second peripheral region (III). The first substrate 100 may have various planar shapes depending on a shape of the organic light emitting display device. For example, when the organic light emitting display device has a rectangular shape, the first substrate 100 may also have the rectangular shape. In an example embodiment, the first substrate 100 may have a rectangular shape extending in a first direction.

The display region (I) may correspond to a central portion of the organic light emitting display device, and may be configured to transmit an image output.

The first peripheral region (II) may correspond to at least one edge portion of the organic light emitting display device. The first peripheral region (II) may surround at least one side of the display region (I). For example, the first peripheral region (II) may surround, e.g., extend along, three sides of the display region (I) as illustrated in FIG. 1.

The second peripheral region (III) may correspond to an edge portion of the organic light emitting display device. The second peripheral region (III) may surround at least one side of the display region (I) where the first peripheral region (II) is not located, e.g., the first and second peripheral regions (II) and (III) extend along different edges of the display region (I) so as not to overlap each other. For example, the second peripheral region (III) may surround one side of the display region (I) as illustrated in FIG. 1.

For example, as illustrated in FIG. 1, the second peripheral region (III) may extend in the first direction, and may surround a bottom side of the display region (I). In another example, the second peripheral region (III) may extend in a second direction substantially perpendicular to the first direction, and may surround a right side or a left side of the display region (I).

Referring to FIG. 2, the organic light emitting display device may include the first substrate 100, a plurality of pixels 10, a scan driving circuit 20, a light emitting control circuit 30, a data driving circuit 40, and a pad portion 50.

The plurality of pixels 10 may be disposed on the first substrate and may be arranged in the display region (I). The pixels 10 may be arranged in the first direction and the second direction, thereby forming a matrix. A detailed structure of each pixel 10 will be described with reference to FIG. 3. The plurality of pixels 10 may be arranged to form repeating units.

The scan driving circuit 20 may be disposed on the first substrate 100 and in the first peripheral region (II). For example, the scan driving circuit 20 may be disposed at a left side or a right side of the plurality of pixels 10. The scan driving circuit 20 may generate a scan signal in response to a driving power signal and a control signal supplied from an external portion, and may supply the scan lines (S1 to Sn) with the scan signal sequentially. Therefore, the plurality of pixels 10 may be selected by the scan signal, and may receive a data signal during a selected period.

The light emitting control circuit 30 may be disposed on the first substrate 100 and in the first peripheral region (II). For example, the scan driving circuit 20 may be disposed at an opposite side of the scan driving circuit 20. The light emitting control circuit 30 may supply the light emitting control lines (E1 to En) with a light emitting control signal, in response to the driving power signal and the control signal supplied from the external portion. Therefore, the plurality of pixels 10 may be controlled by the light emitting signal.

The data driving circuit 40 may be disposed on the first substrate 100 and in the second peripheral region (III). The data driving circuit 40 may generate a data signal in response to the driving power signal and the control signal supplied from the external portion, and may supply the data lines (D1 to Dm) with the data signal. The data signal supplied to the data lines (D1 to Dm) may be supplied to the plurality of pixels 10 which may be selected by the scan signal. Therefore, a circuit disposed in the pixels 10 may be charged in response to the data signal.

Further, the pad portion 50 may be disposed on the first substrate 100 and in the second peripheral region (III). The pad portion 50 may be spaced apart from the plurality of pixels 10, e.g., with the data driving circuit 40 as the center. For example, as illustrated in FIG. 2, the data driving circuit 40 may be positioned between the pad portion 50 and the plurality of pixels 10. The pad portion 50 may include a plurality of pads for supplying the driving power signal and the control signal to an inside of the organic light emitting display device. The plurality of pads in the pad portion 50 may be electrically connected to the scan driving circuit 20, the light emitting control circuit 30, and the data driving circuit 40 through a wiring structure 60. For convenience of description, the wiring structure 60 may include the scan lines (S1 to Sn), the light emitting control lines (E1 to En), the data lines (D1 to Dm), other signal lines and other power supply lines.

In example embodiments, the scan driving circuit 20 may be disposed at a right side of the plurality of pixels 10, the light emitting control circuit 30 may be disposed at a left side of the plurality of pixels 10, and the data driving circuit 40 and the pad portion 50 may be disposed at a bottom side of the plurality of pixels 10, as illustrated in FIG. 2. However, embodiments are not limited thereto. For example, the scan driving circuit 20 may be disposed at the left side of the plurality of pixels 10, and the light emitting control circuit 30 may be disposed at the right side of the plurality of pixels 10.

In example embodiments, the scan driving circuit 20 and the light emitting control circuit 30 may be separated from each other with the plurality of pixels 10 therebetween. However, embodiments are not limited thereto. For example, the scan driving circuit 20 and the light emitting control circuit 30 may be formed integrally. In some example embodiments, the light emitting control circuit 30 may be omitted depending on the structures of the pixels 10.

Referring to FIG. 3, the display region (I) may include a plurality of pixels (P), and the first peripheral region (II) may include a plurality of transmission portions (T2), e.g., defined as transmission windows. It is noted that the plurality of pixels (P) hereinafter and the plurality of pixels 10 in FIG. 2 may be used interchangeably.

As mentioned above, the display region (I) may include the plurality of pixels (P) which may be arranged in the first direction and the second direction. Each of the pixels (P) may include a first transmission portion (T1) and at least one light emitting portion. For example, each of the pixels (P) may include the first transmission portion (T1), a first light emitting portion (P1), a second light emitting portion (P2), and a third light emitting portion (P3) as illustrated in FIG. 3. However, the number of the light emitting portions is not limited herein.

The first transmission portion (T1) may have a transmittance which may be substantially higher than those of other portions of the pixels (P). For example, the transmittance of the first transmission portion (T1) may be substantially higher than those of the light emitting portions (P1, P2, P3) within the same pixel (P). As a plurality of the first transmission portions (T1) is arranged in the first direction and the second direction, e.g., in accordance with the arrangement of the plurality of pixels (P), the display region (I) may have a predetermined transmittance. In an example embodiment, the first transmission portion (T1) may have a ratio ranging from about 20% to about 90% with respect to an area of the pixel (P).

For example, the first transmission portion (T1) may have a rectangular shape. In this case, the first transmission portion (T1) may have a first width (W1) in the first direction, and may have a first height (H1) in the second direction. Further, a pitch between adjacent first transmission portions (T1) in the first direction may be a first length (D1), and the first length (D1) may correspond or be equal, to a width of the pixel (P). However, the shape of the transmission portion (T1) may not be specifically limited, and may be modified properly according to a design of, e.g., the display region (I) and the pixels (P).

The first light emitting portion (P1), the second light emitting portion (P2), and the third light emitting portion (P3) may be spaced apart from the first transmission portion (T1) in the first direction. Each of the first light emitting portion (P1), the second light emitting portion (P2), and the third light emitting portion (P3) may have transmittance that is lower than that of the first transmission portion (T1), and that may be higher than that of a remaining portion of the pixel (P).

In example embodiments, the first light emitting portion (P1), the second light emitting portion (P2), and the third light emitting portion (P3) may correspond to a red light emitting portion, a green light emitting portion, and a blue light emitting portion, respectively. Further, the first light emitting portion (P1), the second light emitting portion (P2), and the third light emitting portion (P3) may have different sizes.

In example embodiments, the first light emitting portion (P1), the second light emitting portion (P2), and the third light emitting portion (P3) may extend in the first direction, as illustrated in FIG. 3. Further, the first light emitting portion (P1), the second light emitting portion (P2), and the third light emitting portion (P3) may be separated from each other in the second direction. Alternatively, the first light emitting portion (P1), the second light emitting portion (P2), and the third light emitting portion (P3) may extend in the second direction. Further, the first light emitting portion (P1), the second light emitting portion (P2), and the third light emitting portion (P3) may be separated from each other in the first direction.

Referring again to FIG. 3, the first peripheral portion (II) may include the plurality of the second transmission portions (T2) arranged in the first direction and the second direction. The second transmission portion (T2) may have transmittance that is substantially higher than those of other portions of the first peripheral portion (II). As the plurality of the second transmission portions (T2) is arranged in the first direction and the second direction, the first peripheral region (II) may have a predetermined transmittance.

For example, the second transmission portion (T2) may have a rectangular shape. In this case, the second transmission portion (T2) may have a second width (W2) in the first direction, and may have a second height (H2) in the second direction. In some embodiments, an area of the second transmission portion (T2) may be substantially identical to that of the first transmission portion (T1). In this case, the second width (W2) may be substantially identical to the first width (W1), and the second height (H2) may be substantially identical to the first height (H1).

Further, a pitch between adjacent second transmission portions (T2) in the first direction may be a second length (D2). In some embodiments, the second length (D2) may be substantially identical to the first length (D1). However, the shape of the transmission portion (T2) may not be specifically limited, and may be modified properly according to a design of, e.g., the first peripheral region (II) and the display region (I).

According to example embodiments, the first transmission portion (T1) and the second transmission portion (T2) may have the same shape. Further, the first transmission portion (T1) and the second transmission portion (T2) may be arranged regularly. However, while the display region (I) includes the light emitting portions (P1, P2, P3), the first peripheral region (H) does not include the light emitting portions (P1, P2, P3). Therefore, the display region (I) may have transmittance that is substantially identical to or higher than the transmittance of the first peripheral region (II). For example, as transmittance through the light emitting portions (P1, P2, P3) of the display region (I) may be higher than transmittance through a region between two adjacent second transmission portion (T2) in the first peripheral region (II), transmittance through the display region (I) may be higher than transmittance through the first peripheral region (II).

In example embodiments, the second peripheral region (III) may not include a transmission portion. Therefore, the second peripheral region (III) may have transmittance that is lower than those of the display region (I) and the first peripheral region (II). A detailed structure of the display region (I) and the first peripheral region (II) will be described with reference to FIG. 4 below.

Referring to FIG. 4, the organic light emitting display device may include the first substrate 100, a second substrate 200, a circuit portion, a wiring structure, organic light emitting elements, and an encapsulation structure 190.

The first substrate 100 may include a transparent insulation substrate. For example, the first substrate 100 may include a glass substrate, a quartz substrate, a transparent resin substrate, or the like. In some embodiments, the first substrate 100 may include a flexible substrate.

The first substrate 100 may be substantially identical to or substantially similar to the first substrate 100 described with reference to FIGS. 1 to 3. In example embodiments, the first substrate 100 may be divided into the display region (I) including the plurality of pixels (P), the first peripheral region (II), and the second peripheral region (III) according to the construction of the organic light emitting display device described with reference to FIG. 1. Further, each of the pixels (P) may include the first transmission portion (T1) and at least one light emitting portion (P1, P2, P3), and the first peripheral region (II) may include the plurality of second transmission portions (T2)

A buffer layer 105 may be disposed on the first substrate 100. The buffer layer 105 may provide a flat top surface, and may prevent impurities from diffusing into the first substrate 100. The buffer layer 105 may include an inorganic material, an organic material, or a stacked structure thereof. In some embodiments, the buffer layer 105 may be omitted.

The circuit portion and the wiring structure may be disposed on the buffer layer 105. The circuit portion may include a first thin film transistor (Tr1) in the display region (I), a second thin film transistor (Tr2) in the first peripheral region (II), and wirings 126, 135, and 136 disposed in the first peripheral region (II).

In example embodiments, the first thin film transistor (Tr1) may constitute a pixel circuit for controlling the organic light emitting elements disposed in the light emitting portions (P1, P2, P3) of the pixel (P). The second thin film transistor (Tr2) may constitute the scan driving circuit 20 and the light emitting control circuit 30 described in FIG. 2. Further, the wirings 126, 135, and 136 may constitute the wiring structure 60 described in FIG. 2.

The first thin film transistor (Tr1) may include a first active pattern 110, a first gate electrode 122, a first source electrode 131, and a first drain electrode 132, and the second thin film transistor (Tr2) may include a second active pattern 115, a second gate electrode 124, a second source electrode 134, and a second drain electrode 133.

The active patterns 110 and 115 may include, e.g., at least one of oxide semiconductor, polysilicon, doped polysilicon, amorphous silicon and doped amorphous silicon. In example embodiments, the oxide semiconductor may include a binary compound ($AB_x$), a ternary compound ($AB_xC_y$), a quaternary compound ($AB_xC_yO_z$), etc. which may contain indium (In), zinc (Zn), gallium (Ga), tin (Sn), titanium (Ti), aluminum (Al), hafnium (Hf), zirconium (Zr), magnesium (Mg), etc. These may be used alone or in a mixture thereof. For example, the oxide semiconductor may include a G-I-Z—O layer [$(In_2O_3)_a(Ga_2O_3)_b(ZnO)_c$ layer], wherein a, b, and c are each a real number satisfying a≥0, b≥0, c>0. When the active patterns 110 and 115 are formed of the oxide semiconductor, a transmittance of external light of the light emitting portions (I, II, III) may be increased.

Further, the first active pattern 110 may include a first channel region 111, a first source region 112, and a first drain region 113, and the second active pattern 115 may include a second channel region 116, a second source region 117, and a second drain region 118. The source regions 112 and 117 and the drain regions 113 and 118 may be doped with impurities, and the channel regions 111 and 116 may be disposed between the source regions 112 and 117 and the drain regions 113 and 118, respectively.

A gate insulation layer 120 may be disposed to cover the active patterns 110 and 115, and gate electrodes 122 and 124 may be disposed on the gate insulation layer 120. In example embodiments, the gate electrodes 122 and 124 may overlap the channel regions 111 and 116 of the active patterns 110 and 115, respectively.

Further, the first wiring 126 may be formed simultaneously with the gate electrodes 122 and 124. Therefore, the first wiring 126 may include a material substantially identical to the gate electrodes 122 and 124, and may have a thickness substantially identical to the gate electrodes 122 and 124. Further, the first wiring 126 may be disposed in the first peripheral region (II) not to overlap the second transmission portion (T2).

A first insulating interlayer 130 may be disposed to cover the first wiring 126 and the gate electrodes 122 and 124. Further, source electrodes 131 and 134, and drain electrodes 132 and 133 may be electrically connected to the source regions 112 and 117, and the drain regions 113 and 118, respectively, through the first insulating interlayer 130 and the gate insulation layer 120.

The second wiring 135 and the third wiring 136 may be disposed on the first insulating interlayer 130. The second wiring 135 and the third wiring 136 may be formed simultaneously with the source electrodes 131 and 134, and the drain electrodes 132 and 133. Further, the second wiring 135 and the third wiring 136 may be disposed in the first peripheral region (II) not to overlap the second transmission portion (T2).

The thin film transistors (Tr1, Tr2) illustrated in FIG. 4 may have a top gate structure in which the gate electrodes 122 and 124 are disposed above the active patterns 110 and 115. Alternatively, the transistors may have a bottom gate structure in which the active patterns are disposed above the gate electrodes.

The first thin film transistor (Tr1) may be disposed in the display region (I) and may not overlap the first transmission portion (T1), and the second thin film transistor (Tr2) may be disposed in the first peripheral region (II) and may not overlap the second transmission portion (T2). Accordingly, the second thin film transistor (Tr2) and the wirings 126, 135 and 136 may not overlap the second transmission portion (T2), and the second thin film transistor (Tr2) and the wirings 126, 135 and 136 may not degrade transmittance of the second transmission portion (T2). Further, the second thin film transistor (Tr2) and the wirings 126, 135 and 136 may not be recognized, e.g., visible, by the user.

Then, a planarization layer 140 may be disposed on the first insulating interlayer 130 to cover the thin film transistors (Tr1, Tr2) and the wirings 126, 135 and 136. In example embodiments, the planarization layer 140 may have an upper surface which is substantially flat. In example embodiments, the buffer layer 105, the gate insulation layer 120, the first insulating interlayer 130, and the planarization layer 140 may be disposed not to overlap the first transmission portion (T1) and the second transmission portion (T2). Therefore, transmittances of the first transmission portion (T1) and the second transmission portion (T2) may be improved.

Referring now to FIG. 4, the organic light emitting element including a lower electrode 150, an organic layer structure 170, and an upper electrode 175 may be disposed on the planarization layer 140.

The lower electrode 150 may be electrically connected to the first thin film transistor (Tr1) through the planarization layer 140. In example embodiments, the lower electrode 150 may be disposed in the light emitting portions (P1, P2, P3). Therefore, the lower electrode 150 may not be disposed in the first transmission portion (T1). The lower electrode 150 may include a transparent conductive material such as indium zinc oxide (IZO) or indium tin oxide (ITO).

A pixel defining layer 160 may be disposed on the second insulating interlayer 140 to partially cover the lower electrode 150. In example embodiments, the pixel defining layer 160 may be disposed on a top surface of the planarization layer 140 and sidewalls of the planarization layer 140, the first insulating interlayer 130, the gate insulation layer 120 and the buffer layer 105. In this case, the pixel defining layer 160 may partially cover the transmission portions (T1, T2). In some embodiments, the pixel defining layer 160 may be disposed on a top surface of the planarization layer 140. In this case, the pixel defining layer 160 may not disposed in the transmission portions (T1, T2).

The organic layer structure 170 may include at least one organic light emitting layer. The organic layer structure 170 may optionally include a hole transfer layer, a hole injection layer, an electron transfer layer and/or an electron injection layer. In example embodiment, the organic light emitting layer may emit a red light, a green light or a blue light. For example, one organic light emitting layer in the first light emitting portion (P1) may emit the blue light, another organic light emitting layer in the second light emitting portion (P2) may emit the red light, and the other organic light emitting layer in the third light emitting portion (P3) may emit the green light.

The upper electrode 175 may be disposed on the organic layer structure 170 and the pixel defining layer 160. In example embodiments, the upper electrode 175 may not overlap the first transmission portion (T1). Alternatively, the upper electrode 175 may partially overlap the first transmission portion (T1), or may sufficiently overlap the first transmission portion (T1). For example, the upper electrode 175 may include aluminum (Al), platinum (Pt), silver (Ag), magnesium (Mg), gold (Au), chromium (Cr), tungsten (W), molybdenum (Mo), titanium (Ti) or an alloy thereof. However, the upper electrode 175 may have a relatively thin thickness, so that the upper electrode 175 may have a relatively high transmittance.

A capping layer 180 may extend from the display region (I) into the first peripheral region (II) and the second peripheral region (III). The capping layer 180 may sufficiently cover the upper electrode 170 and the pixel defining layer 160. The capping layer 180 may protect the organic light emitting element, and may prevent or reduce a reflection of light.

Further, the encapsulation structure 190 may be disposed on the capping layer 180. The encapsulation structure 190 may encapsulate the organic light emitting element disposed between the first substrate 100 and the encapsulation structure 190.

In example embodiments, the encapsulation structure 190 may include at least one organic layer and at least one inorganic layer which may be stacked sequentially. For example, the encapsulation structure 190 may include a first organic layer 192, a first inorganic layer 194, a second organic layer 196, and a second inorganic layer 198.

The inorganic layers 194 and 198 may prevent or reduce penetration of oxygen and/or moisture, and the organic layers 192 and 196 may absorb or relieve stresses of the inorganic layers 194 and 198 so as to provide flexibility. In example embodiments, the organic layers 192 and 196 may include a transparent material such as epoxy-based resins, acrylic resins, perylene resins, polyimide resin, or a mixture thereof. The inorganic layers 194 and 198 may include a transparent material such as silicon nitride, aluminum nitride, zirconium nitride, titanium nitride, hafnium nitride, tantalum nitride, silicon oxide, aluminum oxide, titanium oxide, tin oxide, cerium oxide, silicon oxy-nitride (SiON), etc. However, a construction of the encapsulation structure 190 may not be specifically limited disclosed herein. For example, the encapsulation layer 190 may include an inorganic layer-organic layer-inorganic layer-organic layer structure, an inorganic layer-organic layer-inorganic layer structure, an organic layer-inorganic layer-organic layer, etc.

Referring now to FIG. 4, the second substrate 200 may be arranged to oppose to the first substrate 100. A black matrix 205, a color filter 210, and a protection layer 220 may be disposed on the second substrate 200.

The second substrate 200 may include a transparent insulation substrate. For example, the second substrate 200 may include a glass substrate, a quartz substrate, a transparent resin substrate, or the like. Alternatively, the second substrate 200 may include a flexible substrate.

The black matrix 205 may be disposed on a bottom surface of the second substrate 200. In example embodiments, the black matrix 205 may not overlap the first transmission portion (T1), the second transmission portion (T2) and the light emitting portions (P1, P2, P3). Therefore, the black matrix 205 may not degrade the transmittances of the first transmission portion (T1) and the second transmission portion (T2). Further, the black matrix 205 may not shield the light generated from the light emitting portions (P1, P2, P3). For example, the black matrix 205 may include an organic material or an inorganic material such as chromium (Cr) or chromium oxide ($CrO_x$).

The color filter 210 may be disposed on the bottom surface of the second substrate 200 in the light emitting portions (P1, P2, P3). In example embodiments, the color filter 210 may have a relatively high transmittance with respect to the red light, the green light or the blue light.

In example embodiments, the color filter 210 may serve to reduce or prevent reflections of external light, thereby improving visibility of the organic light emitting display device. As the color filter 210 may not be disposed in the first transmission portion (T1) and the second transmission portion (T2), the color filter 210 may not degrade the transmittances of the first transmission portion (T1) and the second transmission portion (T2). Accordingly, the organic light emitting display device including the color filter 210 may have an improved transmittance, compared to other organic light emitting display devices including a polarization plate. The protection layer 220 may be disposed on the color filter 210 and the black matrix 205, thereby protecting the color filter 210 and the black matrix 205.

Further, a filler 250 may be disposed between the first substrate 100 and the second substrate 200. The filler 250 may include an organic material such as an urethane-based resin, a methacrylate resin, an acrylic resin, a polyisoprene, a vinyl resin, an epoxy resin and a cellulose-based resin. The filler 250 may prevent or reduce penetration of oxygen and/or moisture, and may hold the first substrate 100 and the second substrate 200.

In example embodiments, an additional fixing member 260 may be disposed to bond the first substrate 100 and the second substrate 200. For example, the additional fixing member 260 may be a seal including a glass frit material. Alternatively, the additional fixing member 260 may be a frame including a metal or a polymer.

According to example embodiments, the first peripheral region (II) of the first substrate 100 may include the plurality of second transmission portions (T2). The plurality of second transmission portions (T2) may improve the transmittance of the first peripheral region (II). Therefore, the organic light emitting display device may have an unrecognizable interface between the display region (I) and the first peripheral region (II). That is, as both the display region (I) and the first peripheral region (II) have transmission portions of the same shape, size, and pitch, an interface, e.g., boundary, therebetween may not be recognizable and/or visible.

In example embodiments, the second thin film transistor (Tr2) and the wirings 126, 135, and 136 in the first peripheral region (II) may not overlap the second transmission portions (T2), so that the second thin film transistor (Tr2) and the wirings 126, 135, and 136 may not degrade the transmittance of the first peripheral region (II). Further, the second thin film transistor (Tr2) and the wirings 126, 135, and 136 may be covered by the black matrix 205, and the second thin film transistor (Tr2) and the wirings 126, 135, and 136 may not be recognized by the user.

In some embodiments, the second thin film transistor (Tr2) and the wirings 126, 135, and 136 in the first peripheral region (II) may partially overlap the second transmission portions (T2). Therefore, the first peripheral region (II) may have a reduced area.

FIGS. 5 to 12 illustrate cross sectional views of stages in a method of manufacturing an organic light emitting display device in accordance with some example embodiments.

Figure 5:
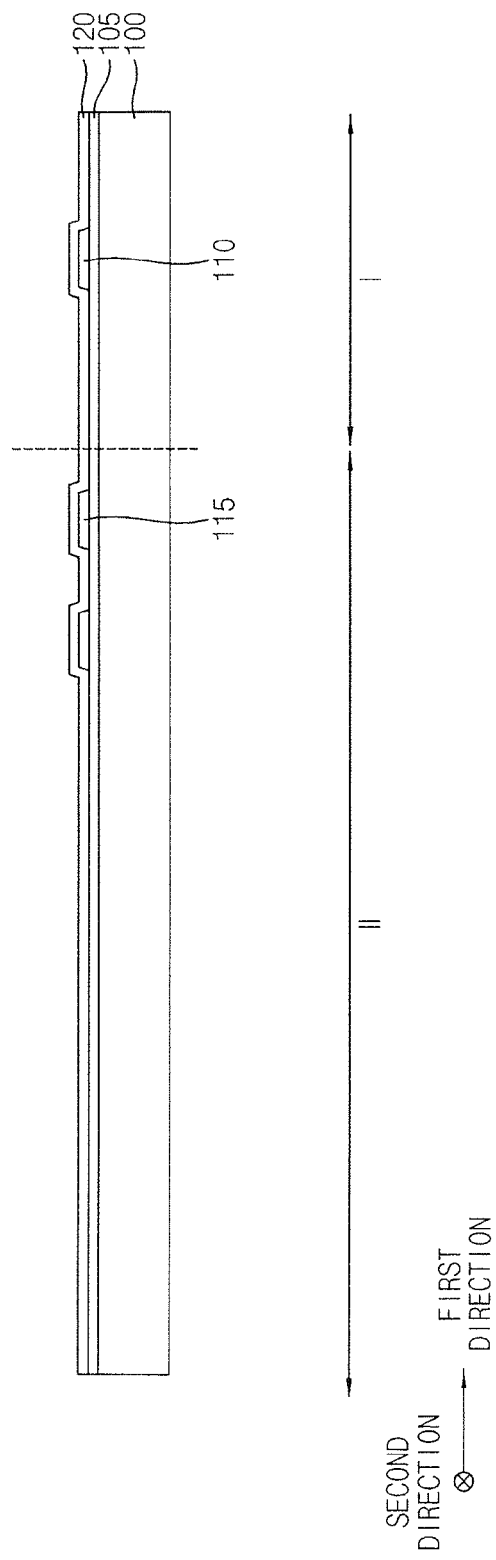
FIGS. 5 to 12 illustrate cross sectional views of stages in a method of manufacturing an organic light emitting display device in accordance with some example embodiments.

Referring to FIG. 5, the buffer layer 105, the active patterns 110 and 115, and the gate insulation layer 120 may be formed on the first substrate 100.

The first substrate 100 may be substantially identical to or substantially similar to the first substrate 100 described with reference to FIGS. 1 to 3. That is, the first substrate 100 may be divided into the display region (I) including the plurality of pixels (P), the first peripheral region (II) and the second peripheral region (III) according to the construction of the organic light emitting display device as described with reference to FIG. 1. Further, each of the pixels (P) may include the first transmission portion (T1) and at least one light emitting portion (P1, P2, P3), and the first peripheral region (II) may include the plurality of second transmission portions (T2).

The buffer layer 105 may be formed on the first substrate 100. The buffer layer 105 may formed by a coating process or a deposition process using an organic material or an inorganic material. For example, the inorganic material may include silicon oxide, silicon nitride, silicon oxy nitride, aluminum oxide, aluminum nitride, titanium oxide or titanium nitride, the organic material may include polyimide, polyester or acryl. In some example embodiments, the buffer layer 105 may be omitted.

A semiconductor layer may be formed on the buffer layer 105 using, e.g., at least one of oxide semiconductor, polysilicon, doped polysilicon, amorphous silicon and doped amorphous silicon, and then the semiconductor layer may be partially etched to form the active patterns 110 and 115. For example, the semiconductor layer may be formed using oxide semiconductor by a sputtering process using a plurality of targets. In example embodiment, the first active pattern 110 may be formed in the display region (I), and the second active pattern 115 may be formed in the first peripheral region (II).

Then, the gate insulation layer 120 may be formed to cover the active patterns 110 and 115. In example embodiments, the gate insulation layer 120 may be formed by a chemical vapor deposition (CVD) process or a sputtering process using silicon oxide, silicon nitride or aluminum oxide.

Figure 6:
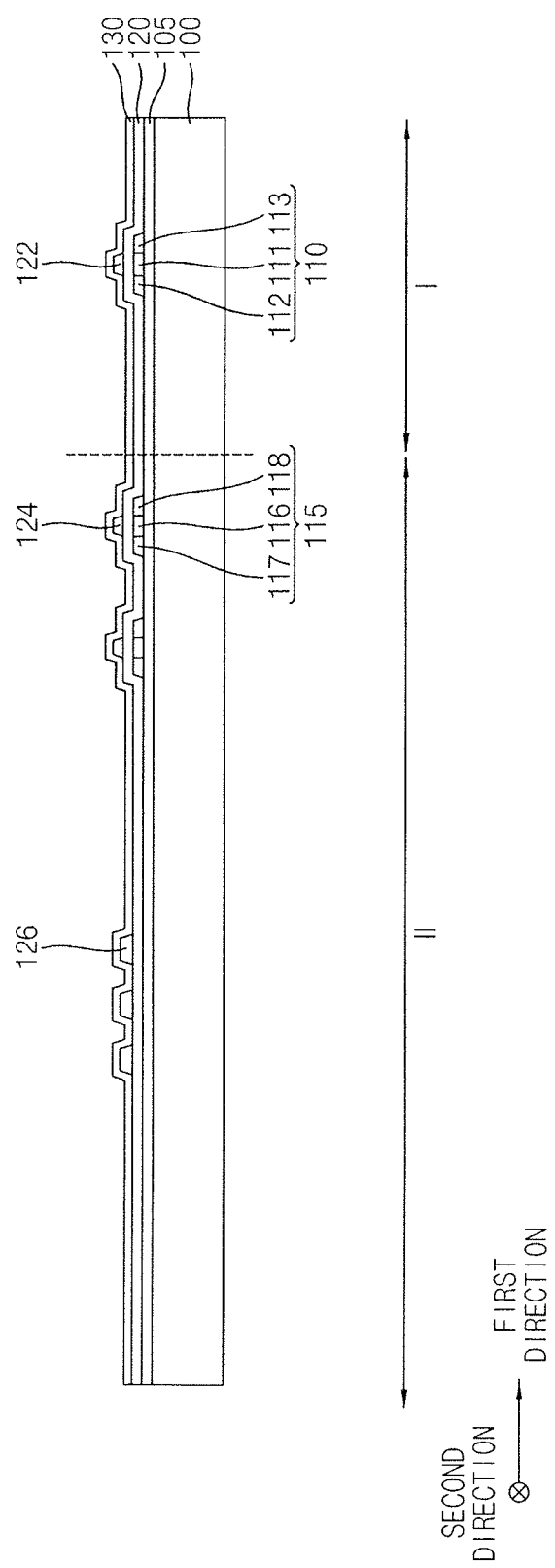

Referring to FIG. 6, the first wirings 126 and the gate electrodes 122 and 124 may be formed on the gate insulation layer 120. A first conductive layer may be formed on the gate insulation layer 120, and then the first conductive layer may be partially removed to form the first wirings 126 and the gate electrodes 122 and 124. The first wirings 126 and the gate electrodes 122 and 124 may be formed simultaneously. Alternatively, the first wirings 126 and the gate electrodes 122 and 124 may be formed sequentially.

In example embodiments, the first gate electrode 122 may overlap the first active pattern 110, and the second gate electrode 124 may overlap the second active pattern 115. Further, the first wirings 126 may be formed in the first peripheral region (II).

Then, impurities may be implanted into portions of the active patterns 110 and 115 by using the gate electrodes 122 and 124 as an ion implantation mask, thereby forming the source regions 112 and 117, and the drain regions 113 and 118. Channel regions 111 and 116 may be defined between the source regions 112 and 117, and the drain regions 113 and 118. The first insulating interlayer 130 may be formed to cover the first wirings 126 and the gate electrodes 122 and 124.

Figure 7:
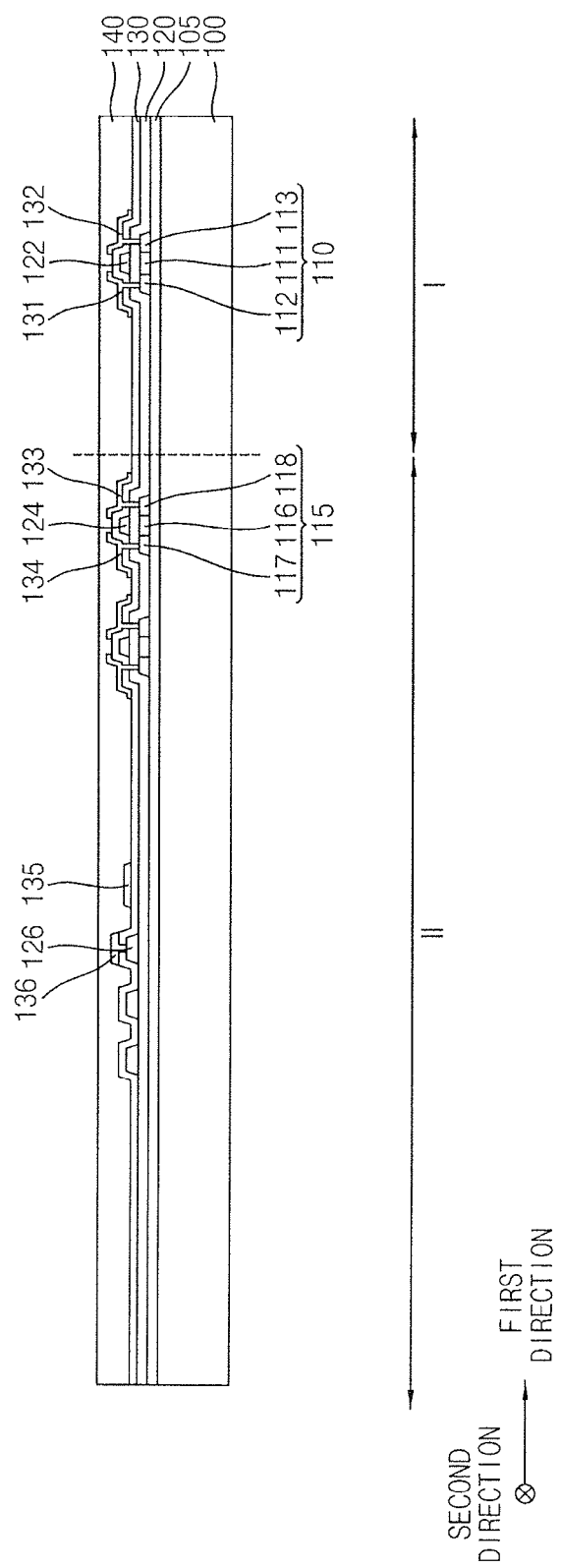

Referring to FIG. 7, the source electrodes 131 and 134, the drain electrodes 132 and 133, the second wiring 135, and the third wiring 136 may be formed on the first insulating interlayer 130.

The first insulating interlayer 130 and/or the gate insulation layer 120 may be partially removed to form contact holes, a second conductive layer may be formed on the first insulating interlayer 130 to fill the contact holes, and then the second conductive layer may be partially removed to form the source electrodes 131 and 134, the drain electrodes 132 and 133, the second wiring 135, and the third wiring 136, respectively.

Accordingly, the first active pattern 110, the first gate electrode 122, the first source electrode 131, and the first drain electrode 132 may constitute a first thin film transistor, and the second active pattern 115, the second gate electrode 124, the second source electrode 134, and the second drain electrode 133 may constitute the second thin film transistor. In example embodiments, the first thin film transistor may constitute a pixel circuit for controlling organic light emitting elements disposed in the light emitting portions (P1, P2, P3). The second thin film transistor (Tr2) may constitute the scan driving circuit 20 and the light emitting control circuit 30 described in FIG. 2. Further, the wirings 126, 135 and 136 may constitute the wiring structure 60 described in FIG. 2.

Then, the planarization layer 140 may be disposed on the first insulating interlayer 130. For example, the planarization layer 140 may be formed using a transparent material such as epoxy-based resins, acrylic resins, perylene-based resins, polyimide resins, or a mixture thereof.

Figure 8:
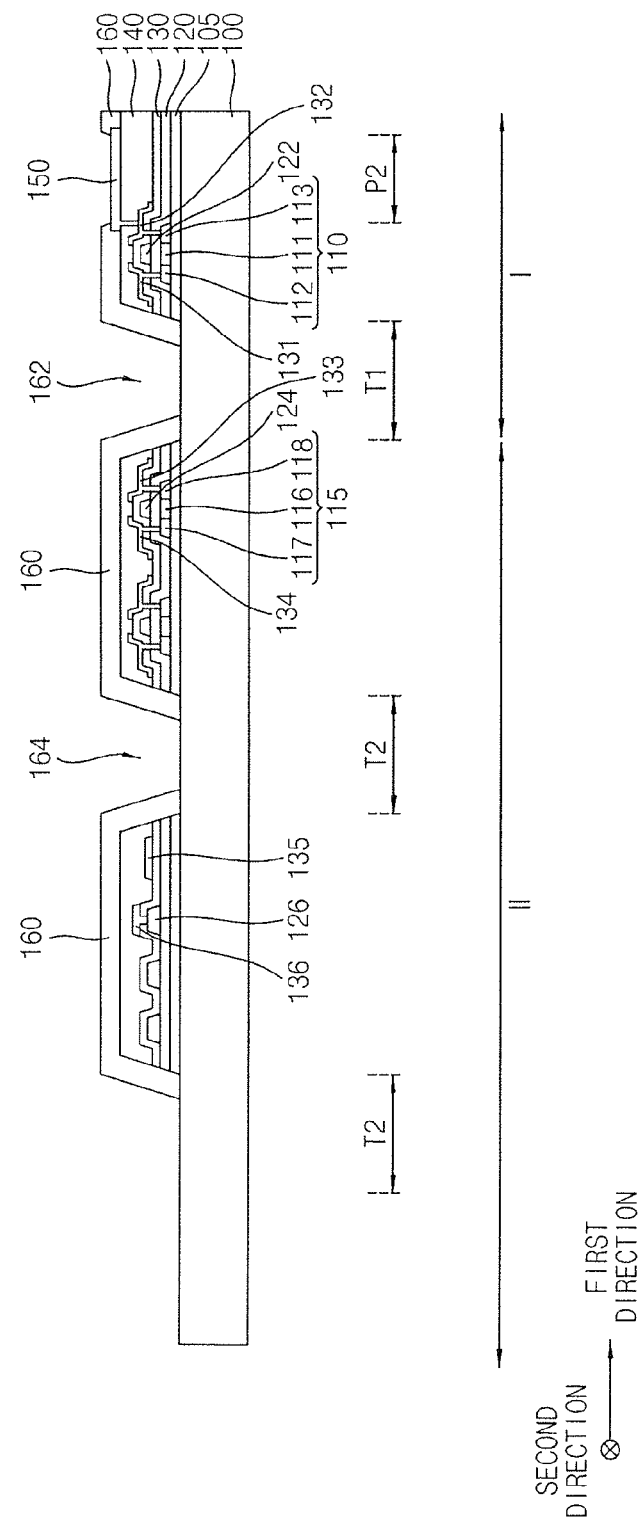

Referring to FIG. 8, openings 162 and 164 may be formed by partially removing the planarization layer 140, the first insulating interlayer 130, the gate insulation layer 120, and the buffer layer 105, and then the lower electrode 150 and the pixel defining layer 160 may be formed.

In example embodiments, the first opening 162 may be formed to correspond to the first transmission portion (T1) in the display region (I), and the second opening 164 may be formed to correspond to the second transmission portion (T2) in the first peripheral region (II). As the openings 162 and 164 are formed, transmittances of the first and second transmission portions (T1, T2) may be improved.

In example embodiment, the openings 162 and 164 may be formed by removing the planarization layer 140, the first insulating interlayer 130, the gate insulation layer 120 and the buffer layer 105 as illustrated in FIG. 8, however embodiments are not limited thereto. For example, the openings may be formed by removing only the planarization layer 140. Then, the planarization layer 140 may be partially removed to form a contact hole, and the lower electrode 150 may be formed to fill the contact hole.

Further, the pixel defining layer 160 may be formed to partially cover the lower electrode 150. In example embodiments, the pixel defining layer 160 may be formed on a top surface of the planarization layer 140 and sidewall of the planarization layer 140, the first insulating interlayer 130, the gate insulation layer 120, and the buffer layer 105. In this case, the pixel defining layer 160 may cover an edge portion of the first and second transmission portions (T1, T2) as illustrated in FIG. 8. Alternatively, the pixel defining layer 160 may be formed on a top surface of the planarization layer 140. In this case, the pixel defining layer 160 may not cover the first and second transmission portions (T1, T2).

Figure 9:
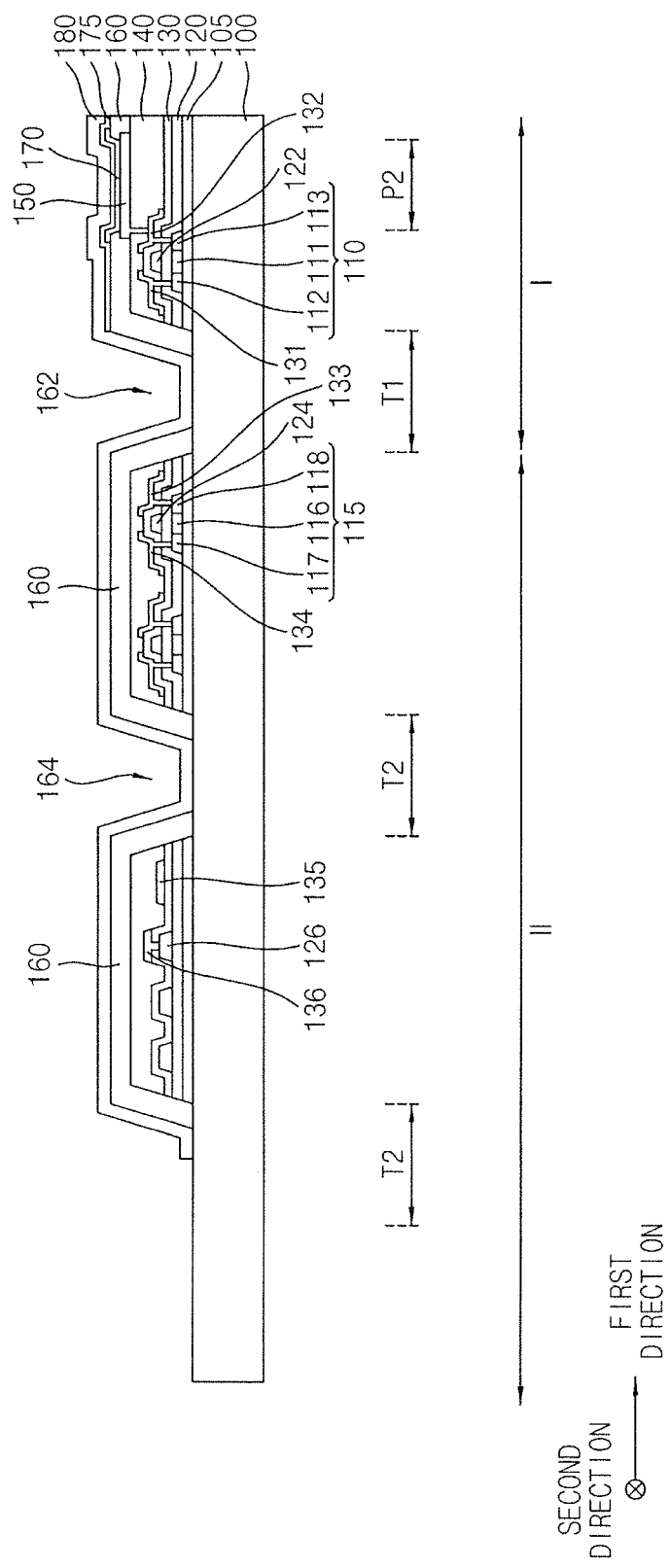

Referring to FIG. 9, the organic layer structure 170, the upper electrode, and the capping layer 180 may be formed.

The organic layer structure 170 may include at least one organic light emitting layer. The organic layer structure 170 may optionally include a hole transfer layer, a hole injection layer, an electron transfer layer and/or an electron injection layer. The upper electrode 175 may be formed on the organic layer structure 170 and the pixel defining layer 160 by using aluminum (Al), platinum (Pt), silver (Ag), magnesium (Mg), gold (Au), chromium (Cr), tungsten (W), molybdenum (Mo), titanium (Ti) or an alloy thereof.

In example embodiment, a conductive metal layer may be formed on the organic layer structure 170 and the pixel defining layer 160, and then the conductive metal layer may be partially removed to form the upper electrode 175. In this case, the upper electrode 175 may not overlap the first and second transmission portions (T1, T2)

In some embodiments, an organic layer pattern may be formed by using a material (e.g., lithium quinoline (LiQ)) which may have a relatively weak adhesion characteristic with respect to a metal, and then the upper electrode 175 may be formed by a metal self patterning process without using a mask. In some embodiments, the upper electrode 175 may sufficiently or partially cover the first and second transmission portions (T1, T2). Then, a capping layer 180 may be formed to cover and protect the organic light emitting elements and the pixel circuits.

Figure 10:
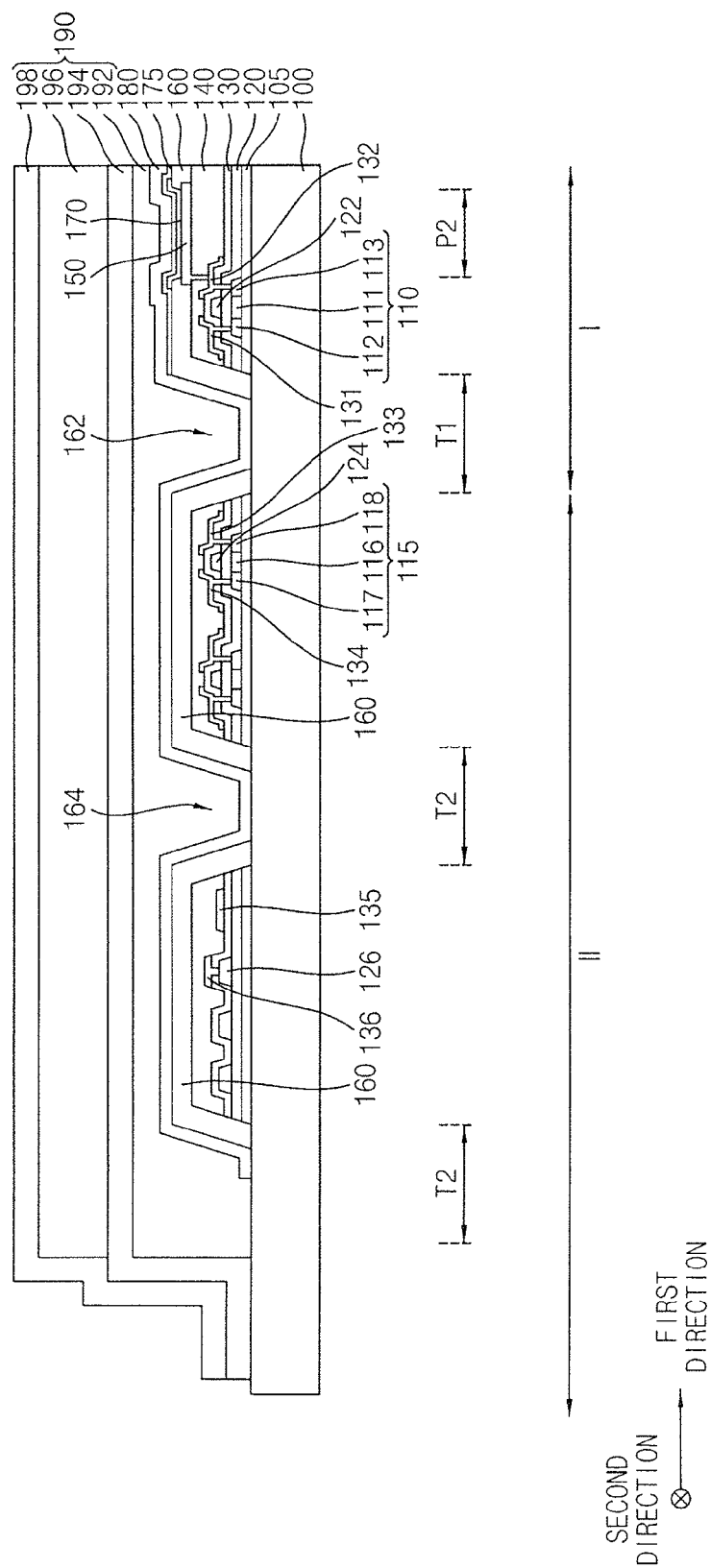

Referring to FIG. 10, the encapsulation structure 190 may encapsulate the organic light emitting element disposed between the first substrate 100 and the encapsulation structure 190. In example embodiments, the encapsulation structure 190 may include at least one organic layer and at least one inorganic layer which may be stacked sequentially and alternately. For example, the encapsulation structure 190 may be formed by stacking the first organic layer 192, the first inorganic layer 194, the second organic layer 196, and the second inorganic layer 198, sequentially.

In example embodiments, the first organic layer 192 and the second organic layer 196 may be formed by a spin coating process, a spray process, a screen printing process, an inkjet printing process, a dispensing process, etc. Alternatively, the first organic layer 192 and the second organic layer 196 may be formed by a deposition process such as a sputtering process, a CVD process, an E-beam deposition process, a thermal evaporation process, a thermal ion beam assisted deposition (IBAD) process, etc. In example embodiments, the first inorganic layer 194 and the second inorganic layer 198 may be formed by a deposition process such as a sputtering process, a CVD process, an E-beam deposition process, a thermal evaporation process, a thermal ion beam assisted deposition (IBAD) process, etc.

Figure 11:
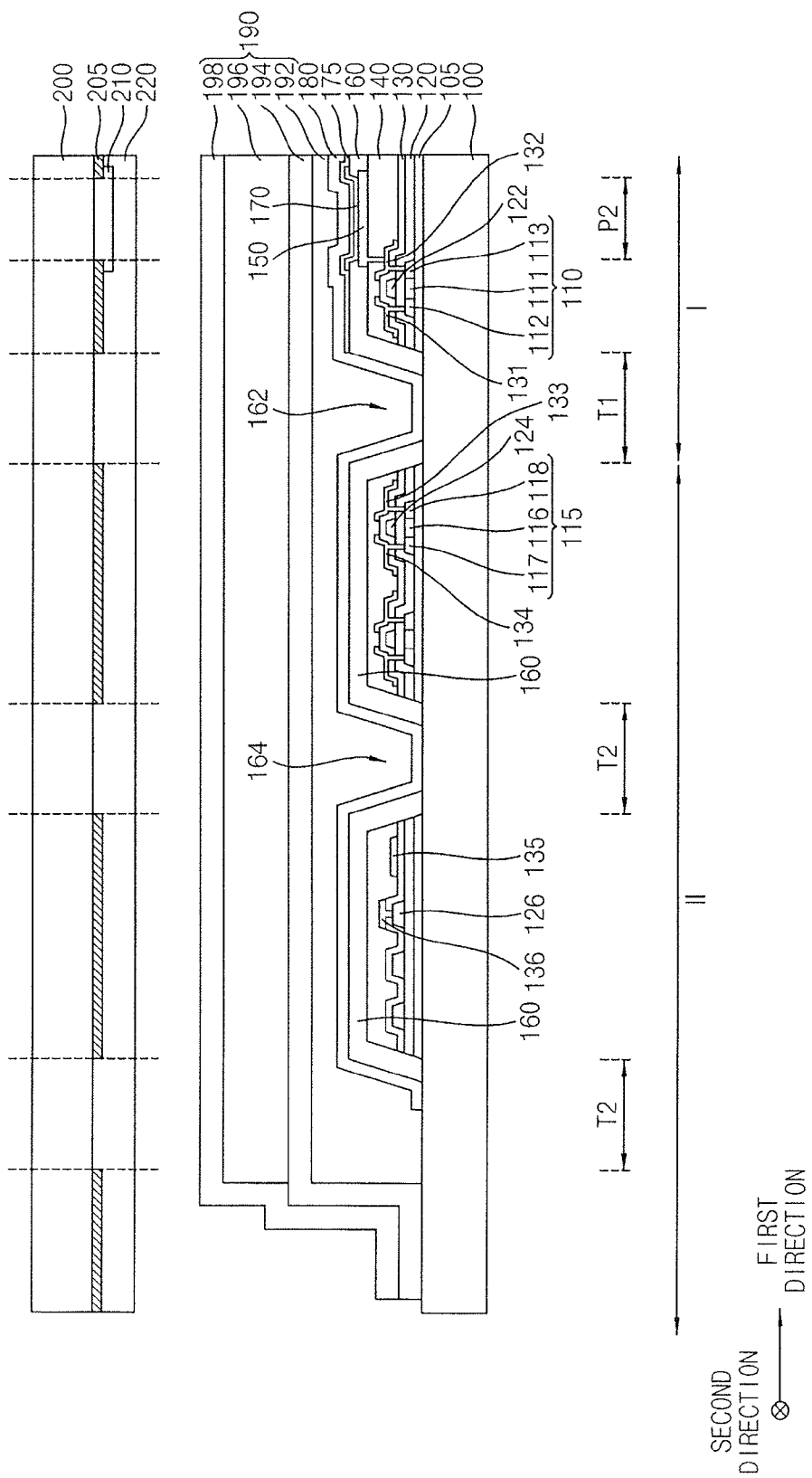

Referring to FIG. 11, the black matrix 205, the color filter 210, and the protection layer 220 may be formed on the second substrate 200.

The black matrix 205 may be formed a bottom surface of the second substrate 200. The black matrix 205 may not overlap the first transmission portion (T1), the second transmission portion (T2) and the light emitting portions (P1, P2, P3). For example, the black matrix 205 may include an organic material or an inorganic material such as chromium (Cr) or chromium oxide (CrOx).

The color filter 210 may be formed on the bottom surface of the second substrate 200 in the light emitting portions (P1, P2, P3). In example embodiments, the color filter 210 may serve to reduce or prevent reflections of external light, thereby improving visibility of the organic light emitting display device.

Figure 12:
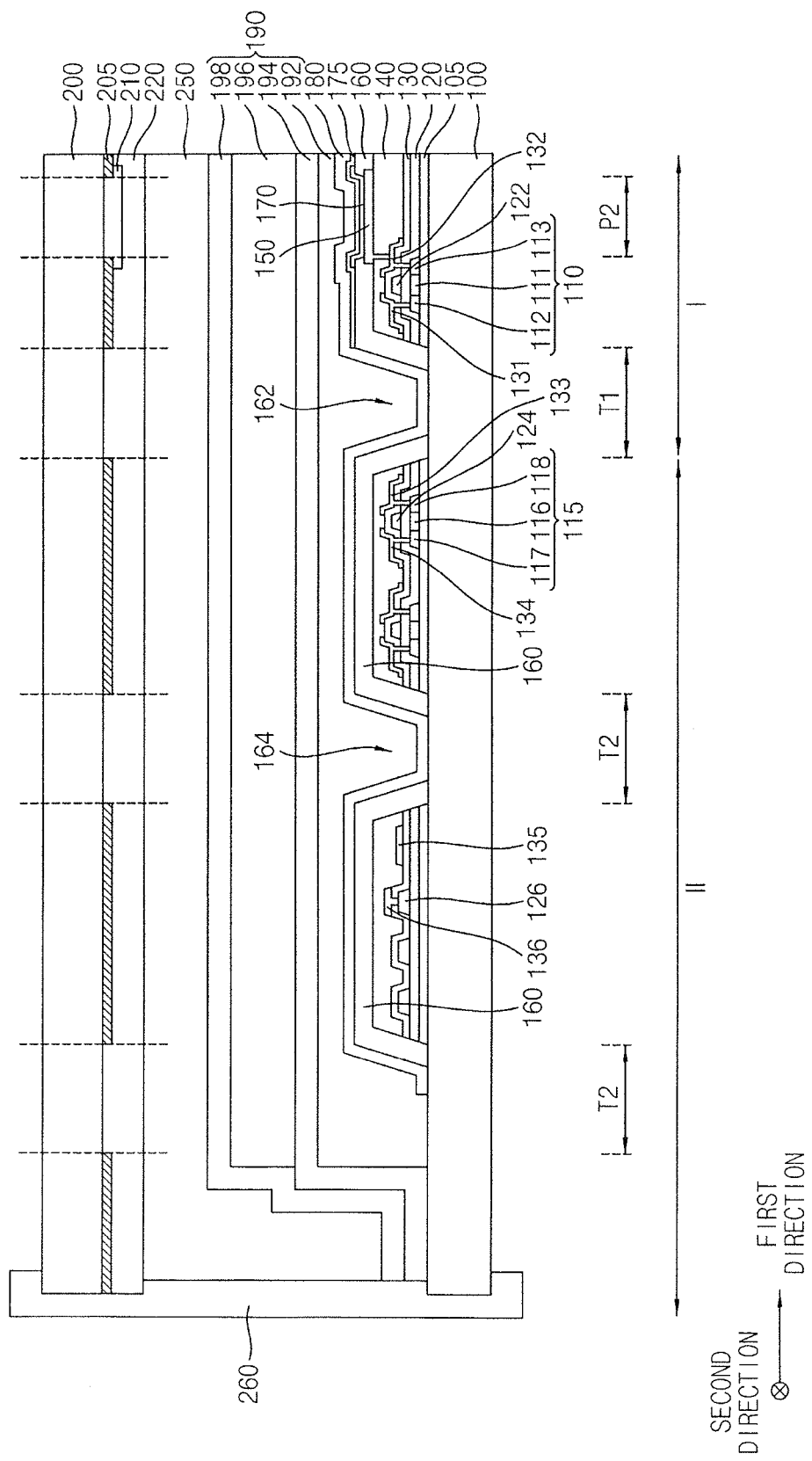

Referring to FIG. 12, the filler 250 may be formed between the first substrate 100 and the second substrate 200, and the additional fixing member 260 may be formed. Further, the filler 250 may fill a space between the first substrate 100 and the second substrate 200. The filler 250 may include an organic material such as an urethane-based resin, a methacrylate resin, an acrylic resin, a polyisoprene, a vinyl resin, an epoxy resin and a cellulose-based resin. The filler 250 may prevent or reduce penetration of oxygen and/or moisture.

In example embodiments, the additional fixing member 260 may be formed to bond the first substrate 100 and the second substrate 200. For example, the additional fixing member 260 may be a seal including a glass frit material. Alternatively, the additional fixing member 260 may be a frame including a metal or a polymer.

Figure 13:
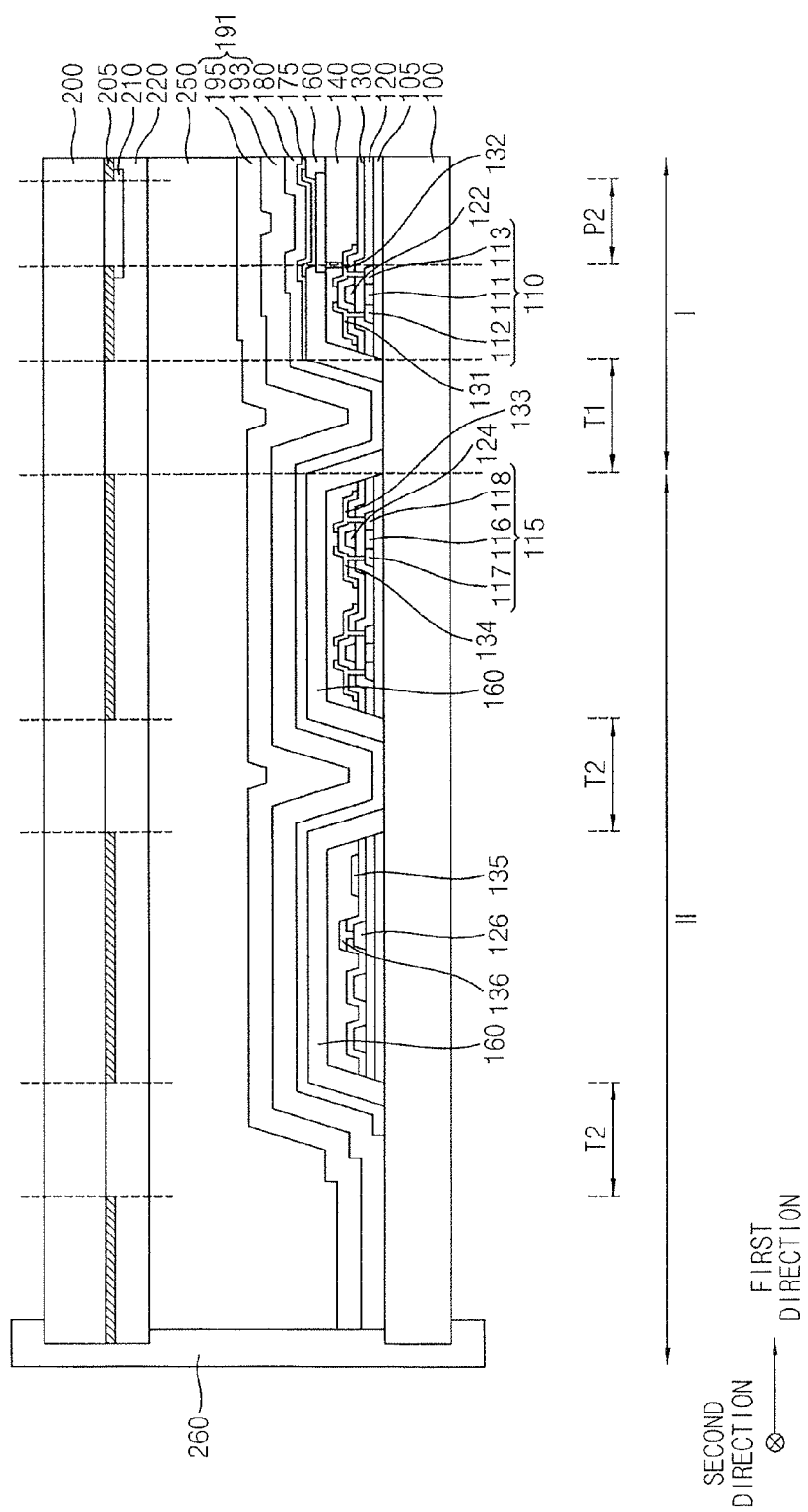
FIG. 13 illustrates a cross sectional view of an organic light emitting display device in accordance with some example embodiments.

FIG. 13 illustrates a cross sectional view of an organic light emitting display device in accordance with some example embodiments. The organic light emitting display device may be substantially similar to the organic light emitting display device described with reference to FIGS. 1 to 4, except for an encapsulation structure 191.

The encapsulation structure 191 may be disposed on the capping layer 180. The encapsulation structure 191 may encapsulate the organic light emitting element disposed between the first substrate 100 and the encapsulation structure 191.

In example embodiments, the encapsulation structure 191 may include at least one inorganic layer. For example, the encapsulation structure 191 may include a first inorganic layer 193 and a second inorganic layer 195. The inorganic layers 193 and 195 may include a transparent material such as silicon nitride, aluminum nitride, zirconium nitride, titanium nitride, hafnium nitride, tantalum nitride, silicon oxide, aluminum oxide, titanium oxide, tin oxide, cerium oxide, silicon oxy-nitride (SiON), etc.

In some example embodiments, the encapsulation structure 191 may include at least one organic layer between the inorganic layers 193 and 195. According to example embodiment, even though the encapsulation structure 191 has simplified structure, the encapsulation structure 191 may effectively encapsulate the organic light emitting element.

Figure 14:
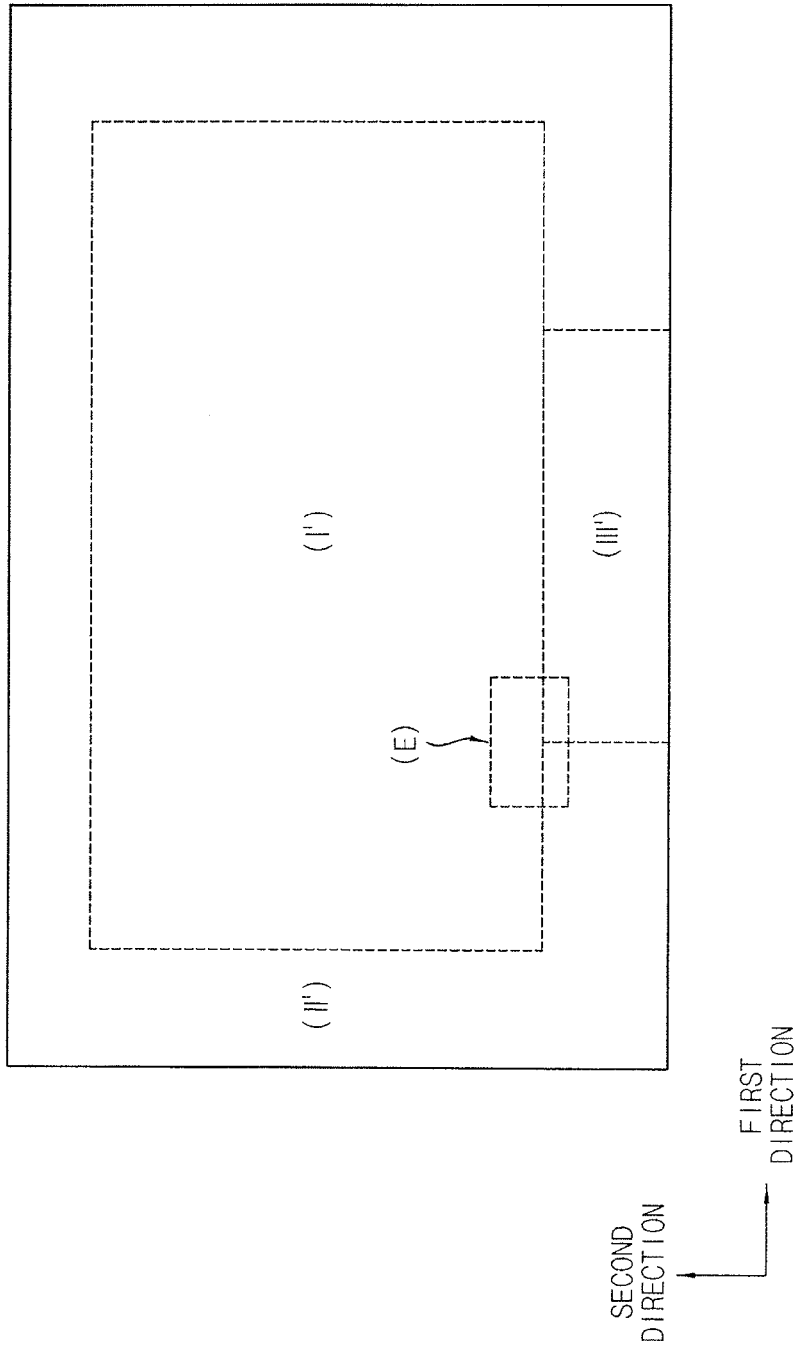
FIG. 14 illustrates a plan view of an organic light emitting display device in accordance with some example embodiments.
Figure 15:
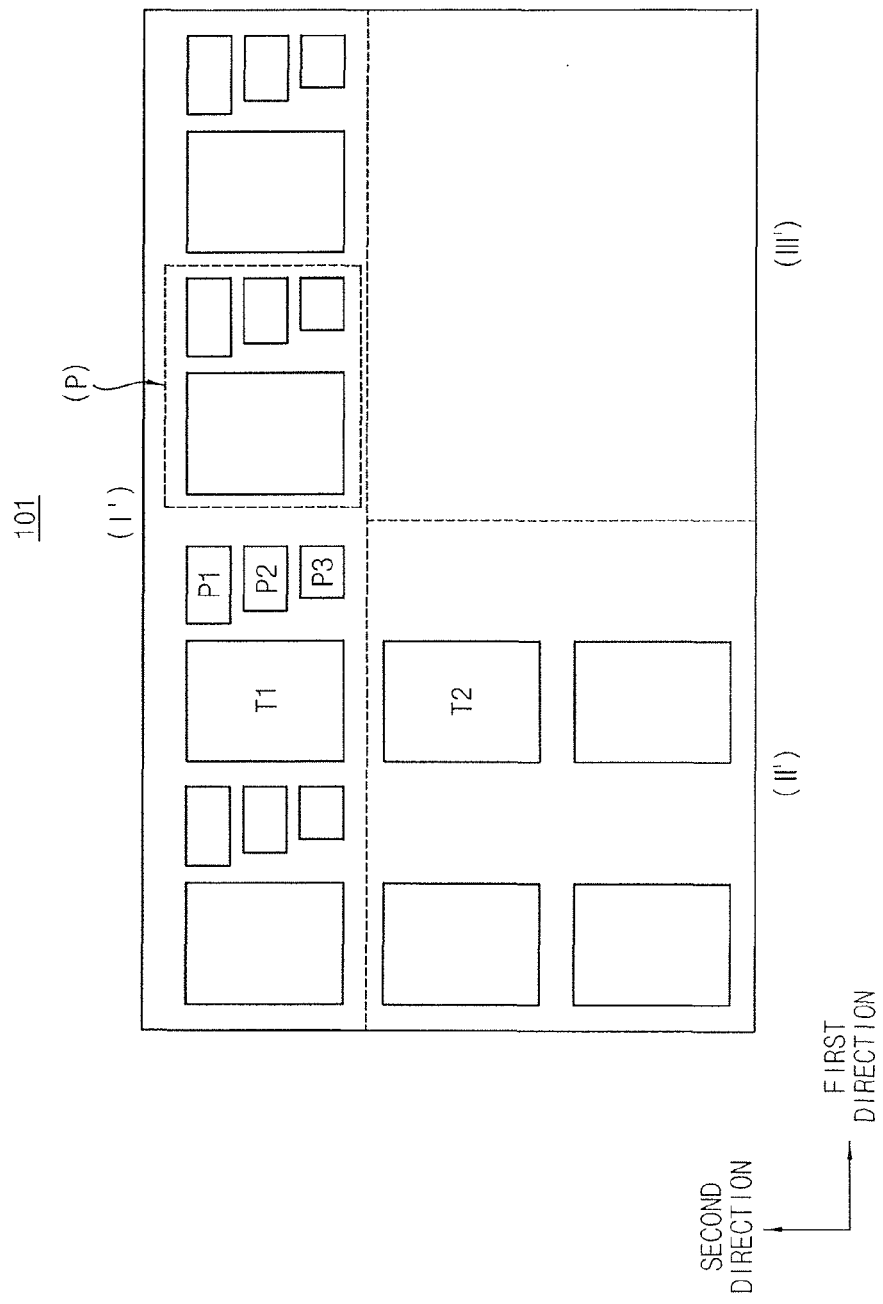
FIG. 15 illustrates an enlarged plan view of region (E) of FIG. 14 in accordance with some example embodiments.

FIG. 14 illustrates a plan view of an organic light emitting display device in accordance with some example embodiments, and FIG. 15 is an enlarged plan view of region (E) of FIG. 14 in accordance with some example embodiments. The organic light emitting display device may be substantially similar to the organic light emitting display device described with reference to FIGS. 1 to 4, except for a first peripheral region (II') and a second peripheral region (III').

Referring to FIG. 14, the organic light emitting display device may have a display region (I'), a first peripheral region (II'), and a second peripheral region (III'). A first substrate 101 may be also divided into the display region (I'), the first peripheral region (II'), and the second peripheral region (III') according to a construction of the organic light emitting display device.

The display region (I') may be disposed at, e.g., a central portion of the organic light emitting display device, and may be configured to transmit an image output. The display region (I') may have various planar shapes, e.g., a rectangular shape.

The first peripheral region (II') may be disposed at, e.g., an edge portion of the organic light emitting display device. The first peripheral region (II') may surround at least one side of the display region (I'). For example, the first peripheral region (II') may surround a right side, a left side, a top side of the display region (I'), and may further partially surround a bottom side of the display region (I') as illustrated in FIG. 14.

The second peripheral region (III') may be disposed at the edge portion of the organic light emitting display device. The second peripheral region (II') may surround at least one side of the display region (I') where the first peripheral region (II') is not located.

In example embodiments, the second peripheral region (III') may extend in the first direction, and may partially surround the bottom side of the display region (I') as illustrated in FIG. 14. In some example embodiments, the second peripheral region (III') may extend in the second direction, and may partially surround a right side or a left side of the display region (I').

Referring to FIG. 15, the display region (I') may include a plurality of pixels (P), and the first peripheral region (II') may include a plurality of second transmission portions (T2). As mentioned above, the display region (I') may include the plurality of pixels (P) which may be arranged in the first direction and the second direction. Each of the pixels (P) may include the first transmission portion (T1) and at least one light emitting portion (P1, P2, P3).

As the plurality of the first transmission portions (T1) is arranged in the first direction and the second direction, the display region (I') may have a predetermined transmittance. Further, as the plurality of the second transmission portions (T2) is arranged in the first direction and the second direction, the first peripheral region (II') may have a predetermined transmittance.

According to example embodiments, the plurality of second transmission portions (T2) may improve the transmittance of the first peripheral region (II'). Therefore, the organic light emitting display device may have an unrecognizable interface between the display region (I') and the first peripheral region (II').

In example embodiments, a second thin film transistor and wirings in the first peripheral region (II') may not overlap the second transmission portions (T2), so that the second thin film transistor and the wirings may not degrade the transmittance of the first peripheral region (II'). Alternatively, the second thin film transistor and the wirings in the first peripheral region (II') may partially overlap the second transmission portions (T2). Therefore, the first peripheral region (II') may have a reduced area.

Figure 16:
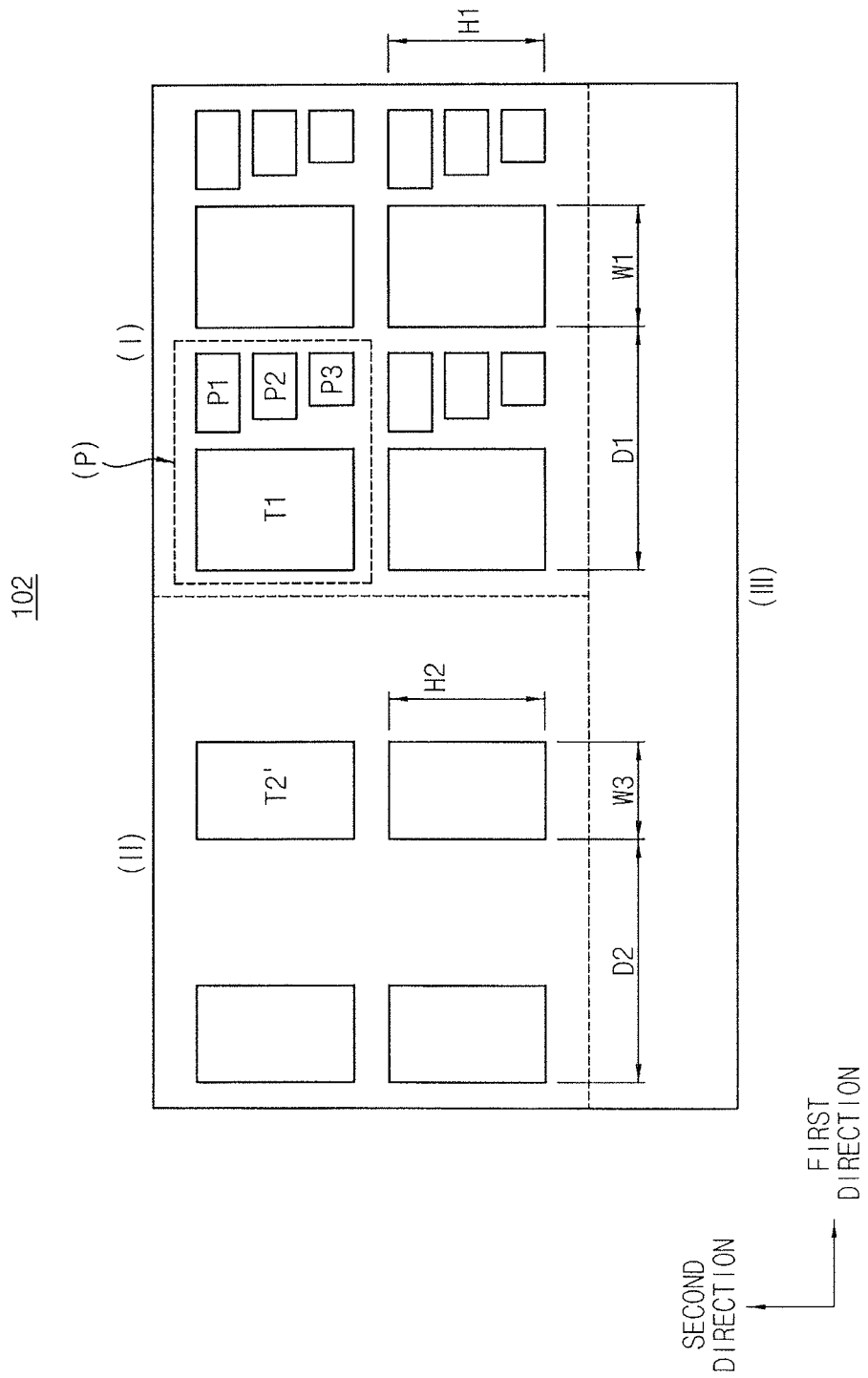
FIG. 16 illustrates an enlarged plan view of region (E) of FIG. 1 in accordance with some example embodiments.

FIG. 16 illustrates an enlarged plan view of region (E) of FIG. 1 in accordance with some example embodiments.

Referring to FIG. 16, a first substrate 102 may be divided into a display region (I), a first peripheral region (II), and a second peripheral region (III) according to a construction of the organic light emitting display device. As mentioned above, the display region (I) may include the plurality of pixels (P) which may be arranged in the first direction and the second direction. Each of the pixels (P) may include a first transmission portion (T1) and at least one light emitting portion (P1, P2, P3).

For example, the first transmission portion (T1) may have a rectangular shape. In this case, the first transmission portion (T1) may have a first width (W1) in the first direction, and may have a first height (H1) in the second direction. Further, a pitch between the adjacent first transmission portions (T1) in the first direction may be a first length (D1), and the first length (D1) may correspond to a width of the pixel (P). However, the shape of the first transmission portion (T1) may not be specifically limited disclosed herein.

The first peripheral portion (II) may include a plurality of the second transmission portions (T2') arranged in the first direction and the second direction. In example embodiments, the second transmission portion (T2') may have a rectangular shape. In this case, the second transmission portion (T2') may have a second width (W3) in the first direction, and may have the second height (H2) in the second direction. Further, a pitch between the adjacent second transmission portions (T2') in the first direction may be the second length (D2). In example embodiments, the second length (D2) may be substantially identical to the first length (D1). However, the shape of the second transmission portion (T2') may not be specifically limited disclosed herein.

In example embodiments, the second width (W3) of the second transmission portion (T2') may be substantially smaller than the first width (W1) of the first transmission portion (T1) as illustrated in FIG. 16. Therefore, each of the second transmission portion (T2') may have a smaller area size than that of each of the first transmission portion (T1).

In some example embodiments, the second height (H2) of the second transmission portion (T2') may be substantially smaller than the first height (H1) of the first transmission portion (T1). In this case, each of the second transmission portion (T2') may have an area which is substantially smaller than that of each of the first transmission portion (T1).

In some example embodiments, the second width (W3) of the second transmission portion (T2) may be substantially smaller than the first width (W1) of the first transmission portion (T1), and the second height (H2) of the second transmission portion (T2') may be substantially smaller than the first height (H1) of the first transmission portion (T1). In this case, each of the second transmission portion (T2') may have an area which may be substantially smaller than that of each of the first transmission portion (T1).

As described with reference to FIGS. 1 to 4, a second thin film transistor and wirings in the first peripheral region (II) may not overlap the second transmission portions (T2'), so that the second thin film transistor and the wirings may not degrade the transmittance of the first peripheral region (II).

As each of the second transmission portion (T2') may have an area which may be substantially smaller than that of each of the first transmission portion (T1), the first peripheral region (II) may have more space for receiving the second thin film transistor and the wirings.

Figure 17:
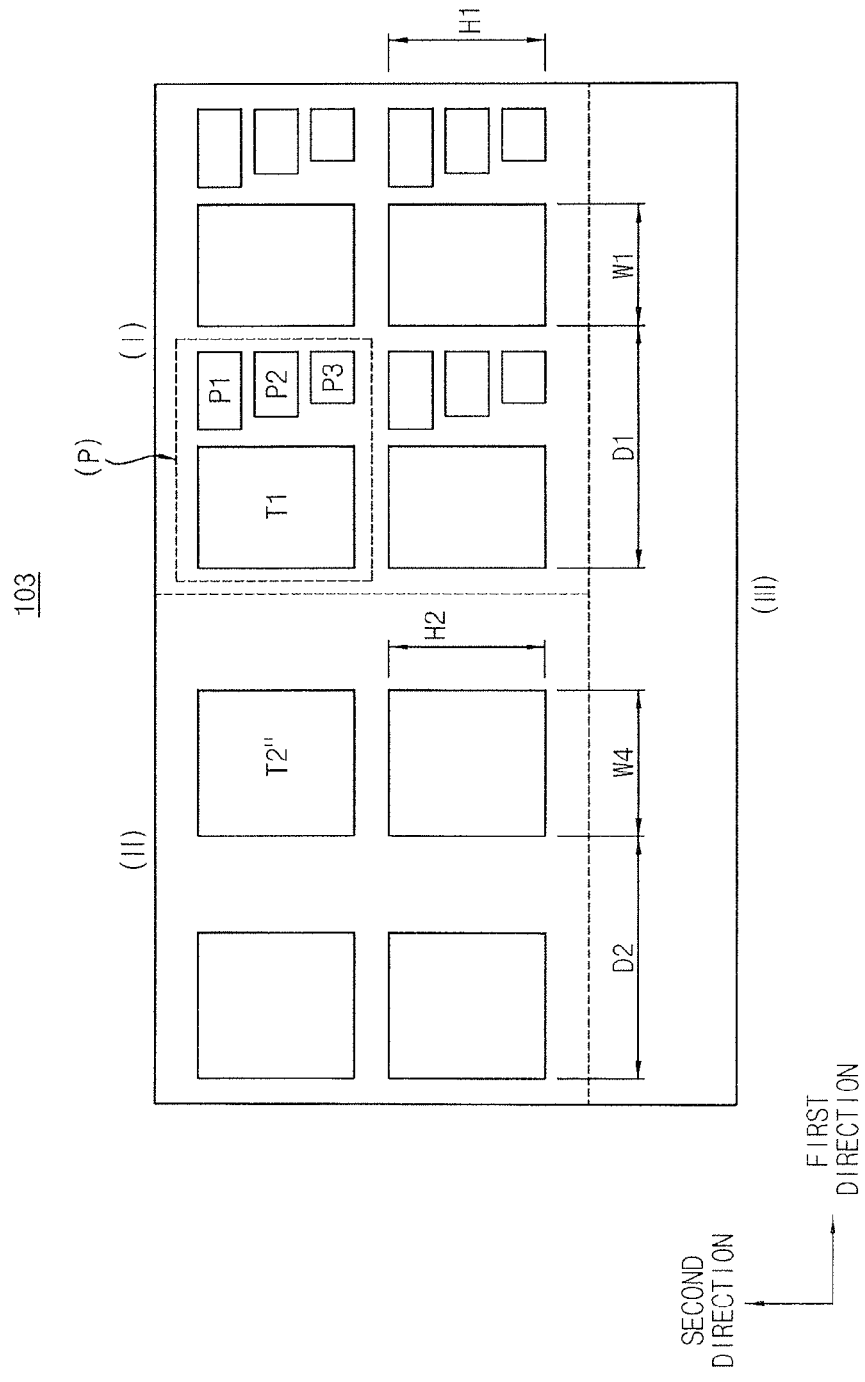
FIG. 17 illustrates an enlarged plan view of region (E) of FIG. 1 in accordance with some example embodiments.

FIG. 17 illustrates an enlarged plan view of region (E) of FIG. 1 in accordance with some example embodiments.

Referring to FIG. 17, a first substrate 103 may be divided into a display region (I), a first peripheral region (II), and a second peripheral region (III) according to a construction of the organic light emitting display device as described with reference to FIG. 1. As mentioned above, the display region (I) may include the plurality of pixels (P) which may be arranged in the first direction and the second direction. Each of the pixels (P) may include a first transmission portion (T1) and at least one light emitting portion (P1, P2, P3).

For example, the first transmission portion (T1) may have a rectangular shape. In this case, the first transmission portion (T1) may have a first width (W1) in the first direction, and may have a first height (H1) in the second direction. Further, a pitch between the adjacent first transmission portions (T1) in the first direction may be a first length (D1), and the first length (D1) may correspond to a width of the pixel (P). However, the shape of the first transmission portion (T1) may not be specifically limited disclosed herein.

The first peripheral portion (II) may include a plurality of the second transmission portions (T2") arranged in the first direction and the second direction. In example embodiments, the second transmission portion (T2") may have a rectangular shape. In this case, the second transmission portion (T2") may have a second width (W4) in the first direction, and may have the second height (H2) in the second direction. Further, a pitch between adjacent second transmission portions (T2") in the first direction may be the second length (D2). In example embodiments, the second length (D2) may be substantially identical to the first length (D1). However, the shape of the second transmission portion (T2") may not be specifically limited disclosed herein.

In example embodiments, the second width (W4) of the second transmission portion (T2") may be substantially larger than the first width (W1) of the first transmission portion (T1) as illustrated in FIG. 17. Therefore, each of the second transmission portion (T2") may have an area which may be substantially larger than that of each of the first transmission portion (T1). In some embodiments, the second height (H2) of the second transmission portion (T2") may be substantially larger than the first height (H1) of the first transmission portion (T1). In this case, each of the second transmission portion (T2") may have an area which may be substantially larger than that of each of the first transmission portion (T1). In some example embodiments, the second width (W4) of the second transmission portion (T2") may be substantially larger than the first width (W1) of the first transmission portion (T1), and the second height (H2) of the second transmission portion (T2") may be substantially larger than the first height (H1) of the first transmission portion (T1). In this case, each of the second transmission portion (T2") may have an area which may be substantially larger than that of each of the first transmission portion (T1).

According to example embodiments, as each of the second transmission portion (T2") has an area that is substantially larger than that of each of the first transmission portion (T1), the first peripheral region (II) may have an improved transmittance. Therefore, the organic light emitting display device may have an unrecognizable interface between the display region (I) and the first peripheral region (II).

Figure 18:
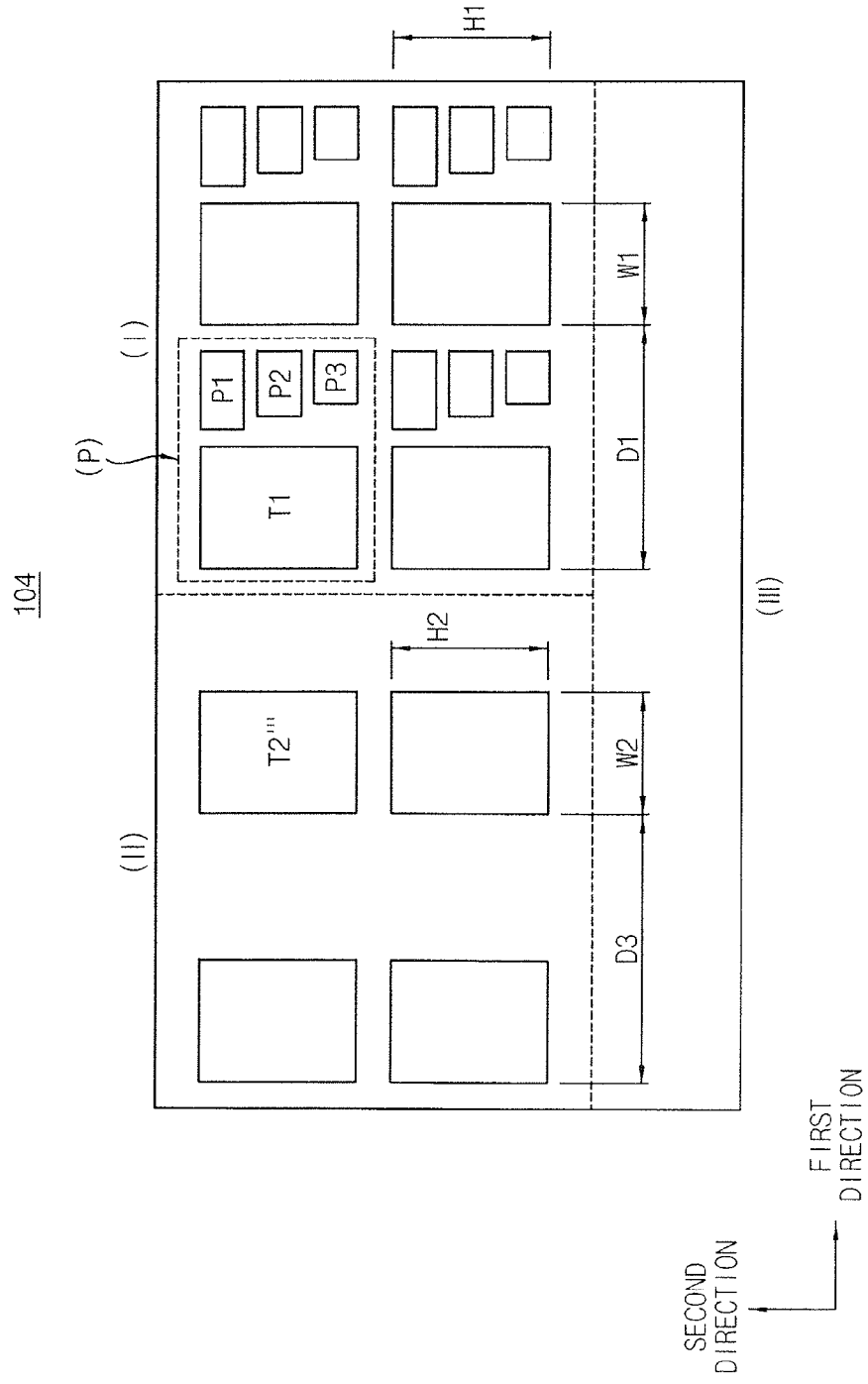
FIG. 18 illustrates an enlarged plan view of region (E) of FIG. 1 in accordance with some example embodiments.

FIG. 18 illustrates an enlarged plan view of region (E) of FIG. 1 in accordance with some example embodiments.

Referring to FIG. 18, a first substrate 104 may be divided into a display region (I), a first peripheral region (II), and a second peripheral region (III) according to a construction of the organic light emitting display device as described with reference to FIG. 1. As mentioned above, the display region (I) may include the plurality of pixels (P) which may be arranged in the first direction and the second direction. Each of the pixels (P) may include a first transmission portion (T1) and at least one light emitting portion (P1, P2, P3).

In example embodiments, the first transmission portion (T1) may have a rectangular shape. In this case, the first transmission portion (T1) may have a first width (W1) in the first direction, and may have a first height (H1) in the second direction. Further, a pitch between the adjacent first transmission portions (T1) in the first direction may be a first length (D1), and the first length (D1) may correspond to a width of the pixel (P). However, the shape of the first transmission portion (T1) may not be specifically limited disclosed herein.

The first peripheral portion (II) may include a plurality of second transmission portions (T2''') arranged in the first direction and the second direction.

In example embodiments, the second transmission portion (T2''') may have a rectangular shape. In this case, the second transmission portion (T2''') may have a second width (W2) in the first direction, and may have a second height (H2) in the second direction. Further, a pitch between adjacent second transmission portions (T2''') in the first direction may be a second length (D3). However, the shape of the second transmission portion (T2''') may not be specifically limited disclosed herein.

In example embodiments, the second length (D3) may be substantially larger than the first length (D1) as illustrated in FIG. 18. In example embodiments, a pitch between the adjacent second transmission portions (T2''') in the second direction may be substantially larger than a pitch between the adjacent first transmission portions (T1) in the second direction.

In example embodiments, the second width (W2) of the second transmission portion (T2''') may be substantially larger than the first width (W1) of the first transmission portion (T1) as illustrated in FIG. 17. In some embodiments, the second height (H2) of the second transmission portion (T2''') may be also substantially larger than the first height (H1) of the first transmission portion (T1). Therefore, each of the second transmission portion (T2''') may have an area which may be substantially larger than that of each of the first transmission portion (T1).

As described with reference to FIGS. 1 to 4, a second thin film transistor and wirings in the first peripheral region (II) may not overlap the second transmission portions (T2'''), so that the second thin film transistor and the wirings may not degrade the transmittance of the first peripheral region (II). As the second length (D3) increases, the first peripheral region (II) may have more space for receiving the second thin film transistor and the wirings.

Figure 19:
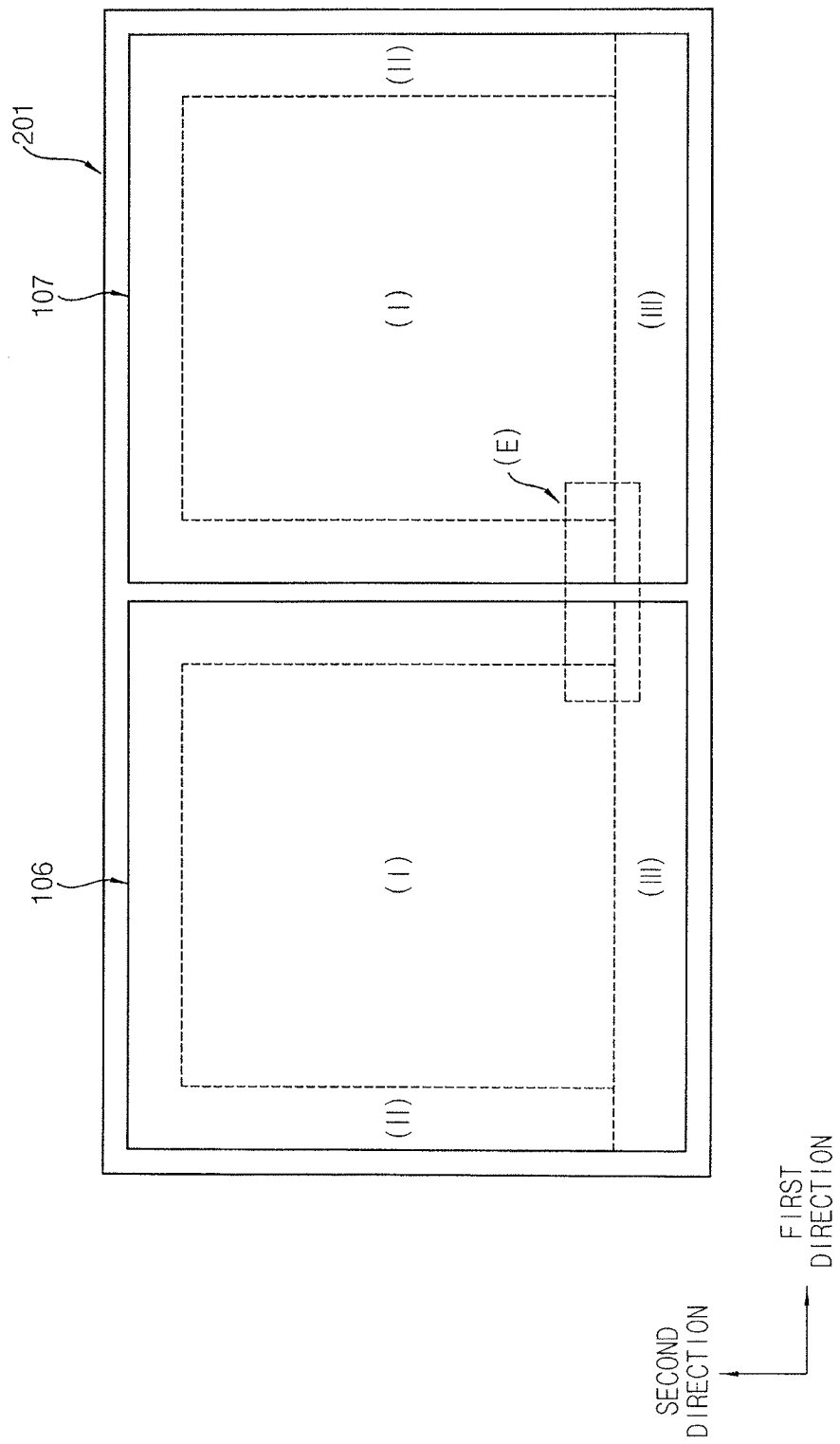
FIG. 19 illustrates a plan view of an organic light emitting display device in accordance with some example embodiments.
Figure 20:
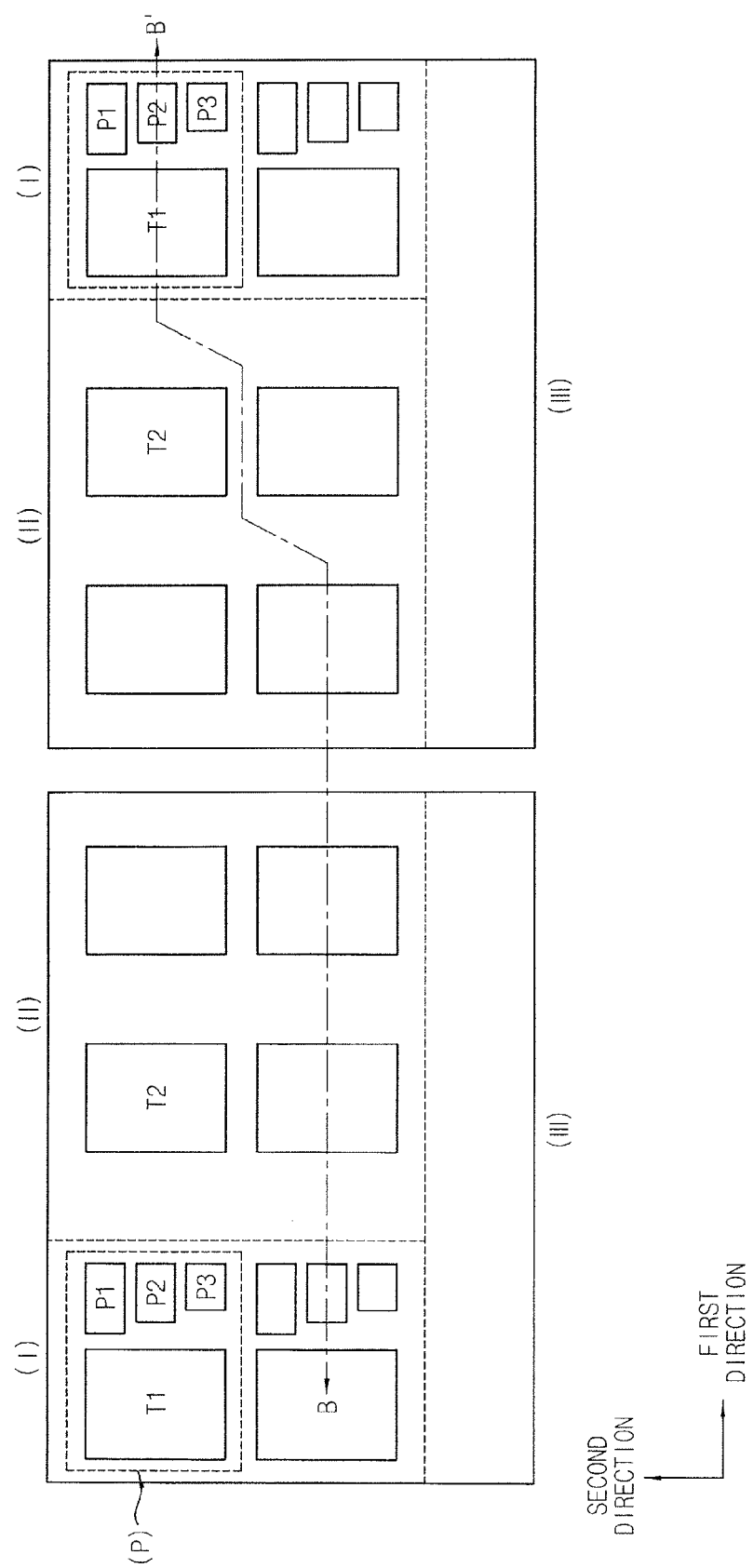
FIG. 20 illustrates an enlarged plan view of region (E) of FIG. 19 in accordance with some example embodiments.
Figure 21:
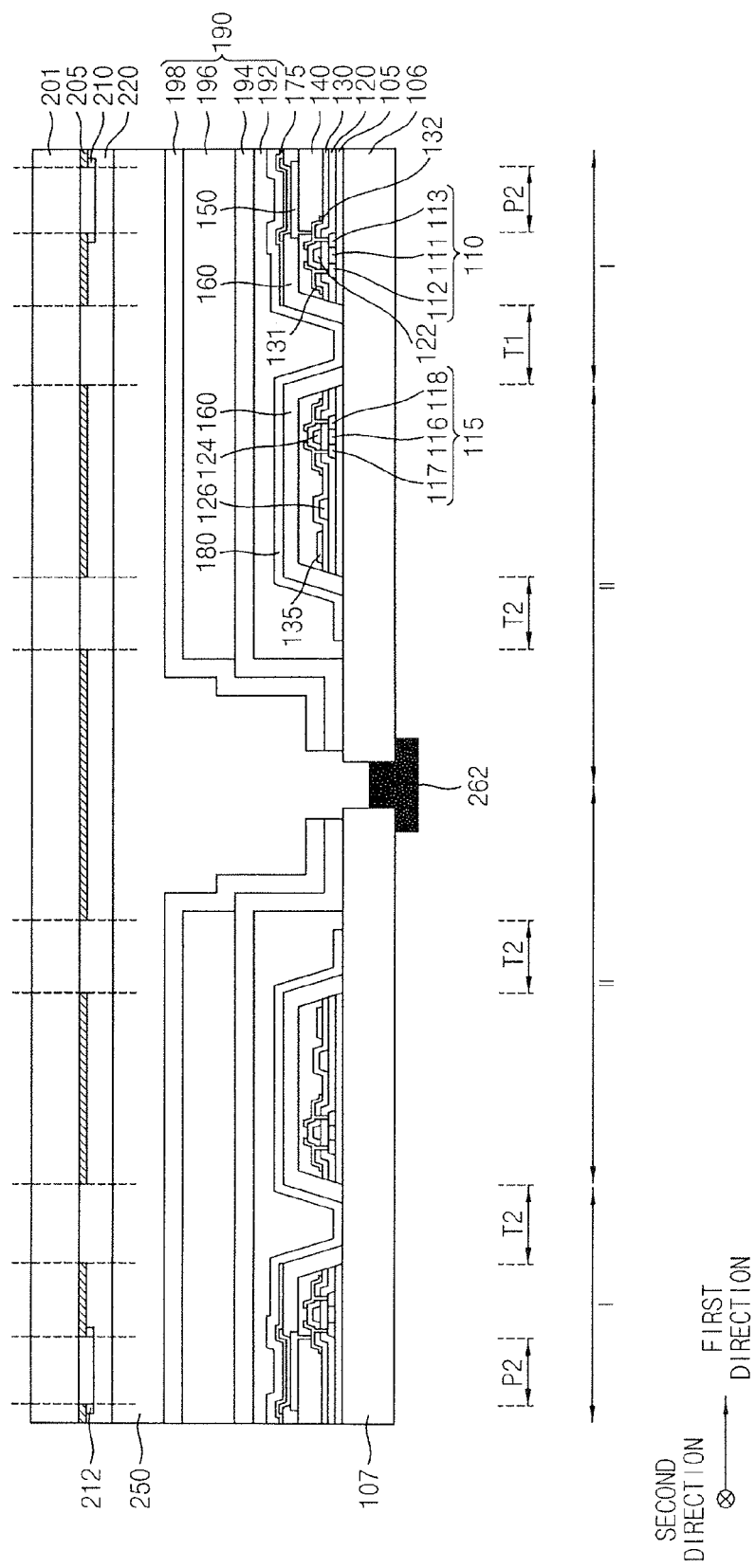
FIG. 21 illustrates a cross sectional view along line B-B' of FIG. 20.

FIGS. 19 to 21 illustrate plan views and a cross sectional view of an organic light emitting display device in accordance with some example embodiments. That is, FIG. 19 is a plan view illustrating an organic light emitting display device in accordance with some example embodiments, FIG. 20 is an enlarged plan view of region (E) of FIG. 19 in accordance with some example embodiments, and FIG. 21 is a cross sectional view cut along a line B-B' of FIG. 20 in accordance with some example embodiments.

Referring to FIG. 19, a first lower substrate 106 and a second lower substrate 107 may be disposed to overlap an upper substrate 201.

The first lower substrate 106 and the second lower substrate 107 may be substantially identical to or substantially similar to the first substrate 100 described with reference to FIGS. 1 to 3. For example, the organic light emitting display device may have the display region (I), the first peripheral region (II), and the second peripheral region (III). The first lower substrate 106 and the second lower substrate 107 may be also divided into the display region (I), the first peripheral region (II), and the second peripheral region (HI).

The first lower substrate 106 and the second lower substrate 107 may be arranged in the first direction as illustrated in FIG. 19. For example, the first lower substrate 106 and the second lower substrate 107 may have bottom surfaces which may have identical height. Further, the second peripheral region (III) of the first lower substrate 106 and the second peripheral region (III) of the second lower substrate 107 may be arranged in the first direction.

In some embodiments, the upper substrate 201 may be substantially identical to or substantially similar to the second substrate 200 described with reference to FIG. 4. However, the upper substrate 201 may be disposed to overlap the plurality of lower substrates 106 and 107.

Referring to FIGS. 20 and 21, each of the first lower substrate 106 and the second lower substrate 107 may include light emitting portions and transmission portions.

In example embodiments, the first lower substrate 106 may include the display region (I) including the plurality of pixels (P), the first peripheral region (II) and the second peripheral region (III). Further, each of the pixels (P) may include the first transmission portion (T1) and at least one light emitting portion (P1, P2, P3), and the first peripheral region (II) may include the plurality of second transmission portions (T2). The second lower substrate 107 may be substantially identical to the first lower substrate 106.

Referring to FIG. 21, the organic light emitting display device may be substantially identical to or substantially similar to the organic light emitting display device described with reference to FIG. 4 except for the second lower substrate 107.

The organic light emitting display device may include the first lower substrate 106 and the second lower substrate 107 arranged with the first lower substrate 106. Further, a gap between the first lower substrate 106 and the second lower substrate 107 may be filled with a seal 262 such as a glass frit.

In some embodiments, the black matrix 205, the color filter 210, and the protection layer 220 may be disposed on the upper substrate 201.

The black matrix 205 may be disposed on a bottom surface of the upper substrate 201. In example embodiments, the black matrix 205 may be disposed not to overlap the first transmission portion (T1), the second transmission portion (T2) and the light emitting portions (P1, P2, P3). Further, the black matrix 205 may be disposed to overlap the gap between the first lower substrate 106 and the second lower substrate 107. Therefore, an interface between the first lower substrate 106 and the second lower substrate 107 may not be recognized by the user.

FIG. 22 illustrates a plan view of an organic light emitting display device in accordance with some example embodiments.

Referring to FIG. 22, the first lower substrate 106, the second lower substrate 107, a third lower substrate 108, and a fourth lower substrate 109 may be disposed to overlap an upper substrate 202.

The first lower substrate 106, the second lower substrate 107, the third lower substrate 108 and the fourth lower substrate 109 may be substantially identical to or substantially similar to the first substrate 100 described with reference to FIGS. 1 to 3. That is, each of the first to fourth lower substrates 106, 107, 108 and 109 may include a display region (I), a first peripheral region (II) and a second peripheral region (III).

The first lower substrate 106 and the second lower substrate 107 may be arranged in a first direction. Further, the second peripheral region (III) of the first lower substrate 106 and the second lower substrate 107 may surround a bottom side of the display region (I), such that the second peripheral region (III) of the first lower substrate 106 and the second peripheral region (III) of the second lower substrate 107 may be arranged in the first direction.

The third lower substrate 108 and the fourth lower substrate 109 may be arranged in a first direction. Further, the second peripheral region (III) of the third lower substrate 108 and the fourth lower substrate 109 may surround a top side of the display region (I), such that the second peripheral region (III) of the third lower substrate 108 and the second peripheral region (III) of the fourth lower substrate 109 may be arranged in the first direction.

Therefore, the second peripheral region (III) having a relatively low transmittance may not be disposed at a central portion of the organic light emitting display device. That is, the second peripheral region (III) may be disposed at a bottom side or a top side of the organic light emitting display device.

Therefore, the black matrix 205 may not degrade the transmittances of the first transmission portion (T1) and the second transmission portion (T2). Further, the black matrix 205 may not shield the light generated from the light emitting portions (P1, P2, P3). For example, the black matrix 205 may include an organic material or an inorganic material such as chromium (Cr) or chromium oxide (CrOx).

In some embodiments, the upper substrate 202 may be substantially identical to or substantially similar to the second substrate 200 described with reference to FIG. 4. However, the upper substrate 202 may be disposed to overlap the plurality of lower substrates 106, 107, 108 and 109.

In example embodiments, a black matrix disposed on the upper substrate 202 may overlap the interface between the first to fourth lower substrates 106, 107, 108 and 109. Therefore, an interface between the first to fourth lower substrates 106, 107, 108 and 109 may not be recognized by the user.

According to example embodiments, the upper substrate 202 may overlap four lower substrates 106, 107, 108 and 109, however embodiments are not limited thereto. For example, the upper substrate 202 may overlap six to twenty substrates.

FIG. 23 illustrates a plan view of an organic light emitting display device in accordance with some example embodiments. The organic light emitting display device may be substantially similar to the organic light emitting display device described with reference to FIGS. 1 to 4 except form a third peripheral region (VI").

Referring to FIG. 23, a first substrate 101" may be divided into a display region (I"), a first peripheral region (II"), a second peripheral region (III") and a third peripheral region (IV") according to a construction of the organic light emitting display device.

The display region (I") may be disposed at a central portion of the organic light emitting display device, and may be configured to transmit an image output. The display region (I") may have a various planar shape such as a rectangular shape. The display region (I') may include the plurality of pixels (P), and each of the pixels (P) may include a first transmission portion (T1) and at least one light emitting portion (P1, P2, P3).

The first peripheral region (II") may surround at least one side of the display region (I). As mentioned above, the first peripheral region (II") may include a plurality of second transmission portions which may be arranged in a first direction and a second direction. In example embodiments, circuits and wirings such as the scan driving circuit 20, the light emitting control circuit 30 and the data driving circuit 40 in FIG. 2 may be disposed in the first peripheral region (II").

The second peripheral region (III") may be disposed at the edge portion of organic light emitting display device. The second peripheral region (II") may surround at least one side of the display region (I") where the first peripheral region (II") may not locate.

The third peripheral region (IV") may be disposed at the edge portion of organic light emitting display device. In example embodiments, the third peripheral region (IV") may surround the first peripheral region (II"), such that the third peripheral region (IV") and the display region (I") may be space apart from each other with the first peripheral region (II") as the center. In example embodiments, circuits and wirings such as the scan driving circuit 20, the light emitting control circuit 30 and the data driving circuit 40 in FIG. 2 may not be disposed in the third peripheral region (IV"). In example embodiment, the third peripheral region (IV") may have a transmittance which may be higher than that of the first peripheral region (II") due to the circuits and the wirings.

By way of summation and review, according to example embodiments, a first substrate of an organic light emitting display device may be divided into a display region (I) and a first peripheral region (II). The first peripheral region (II) may include a plurality of second transmission portions (T2). The plurality of second transmission portions (T2) may improve transmittance of the first peripheral region (II). Therefore, the organic light emitting display device may have an unrecognizable interface between the display region (I) and the first peripheral region (II).

Embodiments may be implemented in various applications in an electronic device having an organic light emitting display device. For example, embodiments may be used in a computer, laptop, digital camera, video camera, cell phone, smart phone, smart pad, PMP, PDA, MP3 players, vehicle navigation, video phone, surveillance system, tracking system, motion detection system, image stabilization system, or the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device having a display region and a first peripheral region surrounding at least one side of the display region, the organic light emitting display device comprising:
    a first substrate;
    a plurality of pixels on the first substrate, the plurality of pixels being included in the display region, at least one of the plurality of pixels including an organic light emitting element; and
    a driving circuit on the first substrate and in the first peripheral region, wherein at least one of the pixels includes a first transmission portion and at least one light emitting portion, and the first peripheral region includes at least one second transmission portion and excludes a light emitting portion, wherein the at least one second transmission portion is between the driving circuit and the display region, and wherein the driving circuit is a scan driving circuit, a data driving circuit, or a light emitting control circuit which transmits signals to the plurality of pixels.

2. The organic light emitting display device as claimed in claim 1, further comprising a second peripheral region surrounding at least one side of the display region where the first peripheral region is not located.

3. The organic light emitting display device as claimed in claim 2, wherein the second peripheral region surrounds one side of the display region.

4. The organic light emitting display device as claimed in claim 3, wherein the second peripheral region partially surrounds one side of the display region.

5. The organic light emitting display device as claimed in claim 1, wherein the first peripheral region and the display region have an identical transmittance.

6. The organic light emitting display device as claimed in claim 1, wherein the first peripheral region has a transmittance which is lower than a transmittance of the display region.

7. The organic light emitting display device as claimed in claim 1, further comprising a third peripheral region surrounding the first peripheral region at an edge of the first substrate, the third peripheral region having a transmittance which is higher than a transmittance of the first peripheral region.

8. The organic light emitting display device as claimed in claim 1, wherein an area of each first transmission portion is identical to an area of each second transmission portion.

9. The organic light emitting display device as claimed in claim 1, wherein an area of each second transmission portion is smaller than an area of each first transmission portion.

10. The organic light emitting display device as claimed in claim 1, wherein an area of each second transmission portion is larger than an area of each first transmission portion.

11. The organic light emitting display device as claimed in claim 1, wherein a distance between adjacent second transmission portions is identical to a distance between adjacent first transmission portions.

12. The organic light emitting display device as claimed in claim 1, wherein a distance between adjacent second transmission portions is larger than a distance between adjacent first transmission portions.

13. The organic light emitting display device as claimed in claim 1, further comprising:
   a second substrate opposed to the first substrate;
   a black matrix disposed on the second substrate; and
   a color filter disposed on the second substrate.

14. The organic light emitting display device as claimed in claim 13, wherein the black matrix exposes the first transmission portion, the second transmission portion, and the at least one light emitting portion, and the color filter overlaps the at least one light emitting portion.

15. The organic light emitting display device as claimed in claim 13, further comprising a filling disposed at a space between the first substrate and the second substrate.

16. The organic light emitting display device as claimed in claim 13, further comprising a fixing member disposed on sides of the first substrate and the second substrate, the fixing member holding the first substrate and the second substrate.

17. The organic light emitting display device as claimed in claim 1, further comprising an encapsulation structure covering the organic light emitting element and the driving circuit.

18. The organic light emitting display device as claimed in claim 17, wherein the encapsulation structure includes at least one organic layer and at least one inorganic layer stacked sequentially and alternately.

19. The organic light emitting display device as claimed in claim 17, wherein the encapsulation structure includes at least one inorganic layer.

20. The organic light emitting display device as claimed in claim 17, wherein the encapsulation structure includes at least one organic layer.

21. The organic light emitting display device as claimed in claim 1, wherein the at least one second transmission portion includes a plurality of second transmission portions, and the plurality of second transmission portions is arranged in a first direction and a second direction, the first direction and the second direction being substantially parallel to a top surface of the first substrate, and being substantially perpendicular to each other.

22. An organic light emitting display device having a display region and a first peripheral region surrounding at least one side of the display region, the organic light emitting display device comprising:
   a first lower substrate;
   a plurality of pixels on the first substrate, the plurality of pixels being included in the display region, at least one of the plurality of pixels including an organic light emitting element;
   a driving circuit on the first lower substrate and in the first peripheral region;
   a second lower substrate adjacent to the first lower substrate, the second lower substrate having a structure identical to a structure of the first lower substrate; and
   an upper substrate overlapping the first lower substrate and the second lower substrate, wherein at least one of the pixels includes a first transmission portion and at least one light emitting portion, and the first peripheral region includes at least one second transmission portion and excludes a light emitting portion, wherein the at least one second transmission portion is between the driving circuit and the display region, and wherein the driving circuit is a scan driving circuit, a data driving circuit, or a light emitting control circuit which transmits signals to the plurality of pixels.

23. The organic light emitting display device as claimed in claim 22, further comprising:
   a black matrix disposed on the upper substrate; and
   a color filter disposed on the upper substrate.

24. The organic light emitting display device as claimed in claim 23, wherein:
   the black matrix exposes the first transmission portion, the second transmission portion, and the at least one light emitting portion, and covers a gap between the first lower substrate and the second lower substrate, and wherein the color filter overlaps the at least one light emitting portion.

25. The organic light emitting display device as claimed in claim 24, further comprising a seal between the first lower substrate and the second lower substrate, the seal holding the first lower substrate and the second lower substrate.

\* \* \* \* \*